(12) United States Patent
Kobayashi

(10) Patent No.: US 8,144,536 B2
(45) Date of Patent: Mar. 27, 2012

(54) SEMICONDUCTOR MEMORY AND SYSTEM

(75) Inventor: Hiroyuki Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 109 days.

(21) Appl. No.: 12/606,288

(22) Filed: Oct. 27, 2009

(65) Prior Publication Data

US 2010/0046307 A1     Feb. 25, 2010

Related U.S. Application Data

(62) Division of application No. 11/892,840, filed on Aug. 28, 2007, now Pat. No. 7,630,260.

(30) Foreign Application Priority Data

Aug. 30, 2006   (JP) ................................. 2006-233204

(51) Int. Cl.
   *G11C 7/00* (2006.01)

(52) U.S. Cl. ... 365/203; 365/206; 365/229; 365/185.02; 365/185.27; 365/189.09; 365/185.23; 365/185.25

(58) Field of Classification Search .................. 365/203, 365/206, 229, 185.27, 185.02, 189.09, 185.23, 365/185.25

See application file for complete search history.

(56) References Cited

U.S. PATENT DOCUMENTS

| | | | |
|---|---|---|---|
| 6,141,259 A * | 10/2000 | Scott et al. ............... | 365/189.06 |
| 6,236,605 B1 * | 5/2001 | Mori et al. ..................... | 365/205 |
| 6,343,044 B1 | 1/2002 | Hsu et al. | |
| 6,657,911 B2 | 12/2003 | Yamaoka et al. | |
| 6,674,112 B1 | 1/2004 | Tadaki et al. | |
| 6,751,144 B2 * | 6/2004 | Takahashi et al. ............ | 365/222 |
| 6,826,072 B2 * | 11/2004 | Takashima .................... | 365/145 |
| 7,035,128 B2 * | 4/2006 | Yamasaki et al. ............... | 365/59 |
| 7,050,323 B2 * | 5/2006 | Takahashi et al. ............ | 365/145 |
| 7,139,208 B2 * | 11/2006 | Arimoto et al. ............... | 365/222 |
| 7,230,867 B2 * | 6/2007 | Takemura et al. ............ | 365/205 |
| 7,245,521 B2 * | 7/2007 | Mori et al. ..................... | 365/156 |
| 7,317,658 B2 * | 1/2008 | Takazawa et al. ......... | 365/233.1 |
| 7,323,727 B2 * | 1/2008 | Kitsukawa et al. ........... | 257/207 |
| 7,345,938 B2 * | 3/2008 | Takemura et al. ............ | 365/205 |
| 7,345,939 B2 | 3/2008 | Lee et al. | |
| 7,372,766 B2 * | 5/2008 | Park et al. ................ | 365/230.06 |
| 7,375,999 B2 * | 5/2008 | Vogelsang .................... | 365/149 |

(Continued)

FOREIGN PATENT DOCUMENTS

JP         04-047588         2/1992

(Continued)

*Primary Examiner* — Viet Q Nguyen
(74) *Attorney, Agent, or Firm* — Arent Fox LLP

(57) ABSTRACT

A word driver supplies a high level voltage to a word line when a memory cell is accessed and supplies low level voltage which is a negative voltage to the word line when the memory cell isn't accessed. A precharge circuit lowers a precharge voltage-supplying capacity to a bit line at least during a standby period when the memory cell is not accessed. A substrate voltage of an nMOS transistor with source or drain connected to the bit line is set to the low level voltage or lower of the word line. Therefore, when the word line and the bit line fails short and the voltage of the bit line changes to the low level voltage of the word line during the standby period, a substrate current can be prevented from flowing between the source of the nMOS transistor and a substrate or the drain and the substrate.

13 Claims, 17 Drawing Sheets

U.S. PATENT DOCUMENTS

| | | | |
|---|---|---|---|
| 7,436,205 B2 * | 10/2008 | Tada | 326/33 |
| 7,486,544 B2 * | 2/2009 | Mori et al. | 365/156 |
| 7,502,275 B2 * | 3/2009 | Nii et al. | 365/226 |
| 7,521,762 B2 * | 4/2009 | Hidaka | 257/369 |
| 7,872,923 B2 * | 1/2011 | Kim | 365/189.05 |
| 2002/0041531 A1 | 4/2002 | Tanaka et al. | |
| 2003/0189852 A1 | 10/2003 | Chen | |
| 2003/0205992 A1 | 11/2003 | Hein et al. | |

FOREIGN PATENT DOCUMENTS

| | | |
|---|---|---|
| JP | 06-052681 | 2/1994 |
| JP | 08-263983 | 10/1996 |
| JP | 11-339470 | 12/1999 |
| JP | 2003-317480 | 11/2003 |
| JP | 2005-135461 | 5/2005 |
| WO | WO-02/41096 | 5/2002 |

* cited by examiner

SEMICONDUCTOR MEMORY AND SYSTEM

CROSS REFERENCE TO RELATED APPLICATION

This application is a divisional application of U.S. application Ser. No. 11/892,840, filed Aug. 28, 2007 now U.S. Pat. No. 7,630,260, which is based and claims the benefit of priority from Japanese Patent Application No. 2006-233204, filed on Aug. 30, 2006, the entire contents of which are incorporated herein by reference.

BACKGROUND

1. Field

The present invention relates to a semiconductor memory including a bit line and a word line connected to a memory cell.

2. Description of the Related Art

In a semiconductor memory such as a DRAM, a memory cell is connected to one of a pair of complementary bit lines via a transfer gate which operates according to the voltage of a word line. In a read operation, data held in the memory cell is outputted to one of the bit lines. Before the read operation, the other of the bit lines is set to a precharge voltage. Then, a voltage difference between the bit line pair is amplified by a sense amplifier and outputted as read data. Generally, while the DRAM stands by, the bit line is set to the precharge voltage, and the word line is set to a ground voltage or a negative voltage.

For example, when the word line and the bit line are electrically shorted and a failure occurs, the failure word line is replaced with a redundancy word line. Alternatively, the failure bit line pair is replaced with a redundancy bit line pair. However, the short between the word line and the bit line physically exists even after the failure is relieved. Therefore, even after the failure is relieved, a leak current flows from a precharge voltage line to a ground line or a negative voltage line via a shorted portion. A DRAM with a large leak current is eliminated as a bad chip.

A method of placing a resistor element between the precharge voltage line and the bit line to reduce a standby current failure caused by the short failure between the word line and the bit line is proposed (for example, Japanese Unexamined Patent Application publication No. Hei 8-263983). Moreover, a method of connecting the bit line to the precharge voltage line only during a given period before the word line is activated and setting the bit line to a floating state during the other period (standby period) is proposed (for example, Japanese Unexamined Patent Application Publication No. Hei 4-47588, Japanese Unexamined Patent Application Publication No. Hei 6-52681).

Further, generally, to prevent a forward current (substrate current) of a pn junction from flowing between a substrate and a source/drain of a transistor, the low level voltages of the source and drain of an nMOS transistor are set to a substrate voltage or higher (for example, Japanese Unexamined Patent Application Publication No. 2005-135461).

In the common DRAM, the substrate voltage of the nMOS transistor connected to the bit line is set to the ground voltage or the negative voltage. The voltage of the bit line changes to an internal power supply voltage or the ground voltage during an access operation and is set to the precharge voltage (half the value of the internal power supply voltage) during the standby period. Hence, the substrate current does not flow to the nMOS transistor connected to the bit line.

However, if a short failure occurs between the word line and the bit line in a semiconductor memory in which the bit line is set to the floating state during the standby period, the voltage of the bit line gradually charges to a low level voltage of the word line during the standby period. If the low level voltage of the word line is lower than the substrate voltage of the nMOS transistor connected to the bit line, the substrate current flows to the nMOS transistor. As a result, even in the semiconductor memory with a specification designed to set the bit line to the floating state during the standby period, a leak current failure occurs.

SUMMARY

An object of the present invention is to prevent a substrate current from flowing to a transistor connected to a bit line when a short failure occurs between a word line and the bit line.

In one aspect of the present invention, a memory cell includes a data memory part and a transfer transistor. A bit line is connected to one of a source/drain of the transfer transistor. A word line is connected to a gate of the transfer transistor. A word driver supplies a high level voltage to the word line when the memory cell is accessed and supplies a low level voltage which is a negative voltage to the word line when the memory cell is not accessed. A precharge circuit includes a precharge switch which connects the bit line to a precharge voltage line and lowers a capacity to supply a precharge voltage to the bit line at least during a standby period when the memory cell is not accessed. A substrate voltage of an nMOS transistor whose source or drain is connected to the bit line is set to the low level voltage or lower of the word line. Therefore, even when a short failure occurs between the word line and the bit line and the voltage of the bit line changes to the low level voltage of the word line during the standby period, the substrate voltage can be prevented from flowing between the source of the nMOS transistor and a substrate or the drain thereof and the substrate. For example, the above nMOS transistor is at least any of a precharge switch, a transistor constituting a sense amplifier, a transistor constituting a column switch, a transfer transistor, and a connection switch connecting the bit line and the sense amplifier.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF THE EMBODIMENTS

Figure 1:
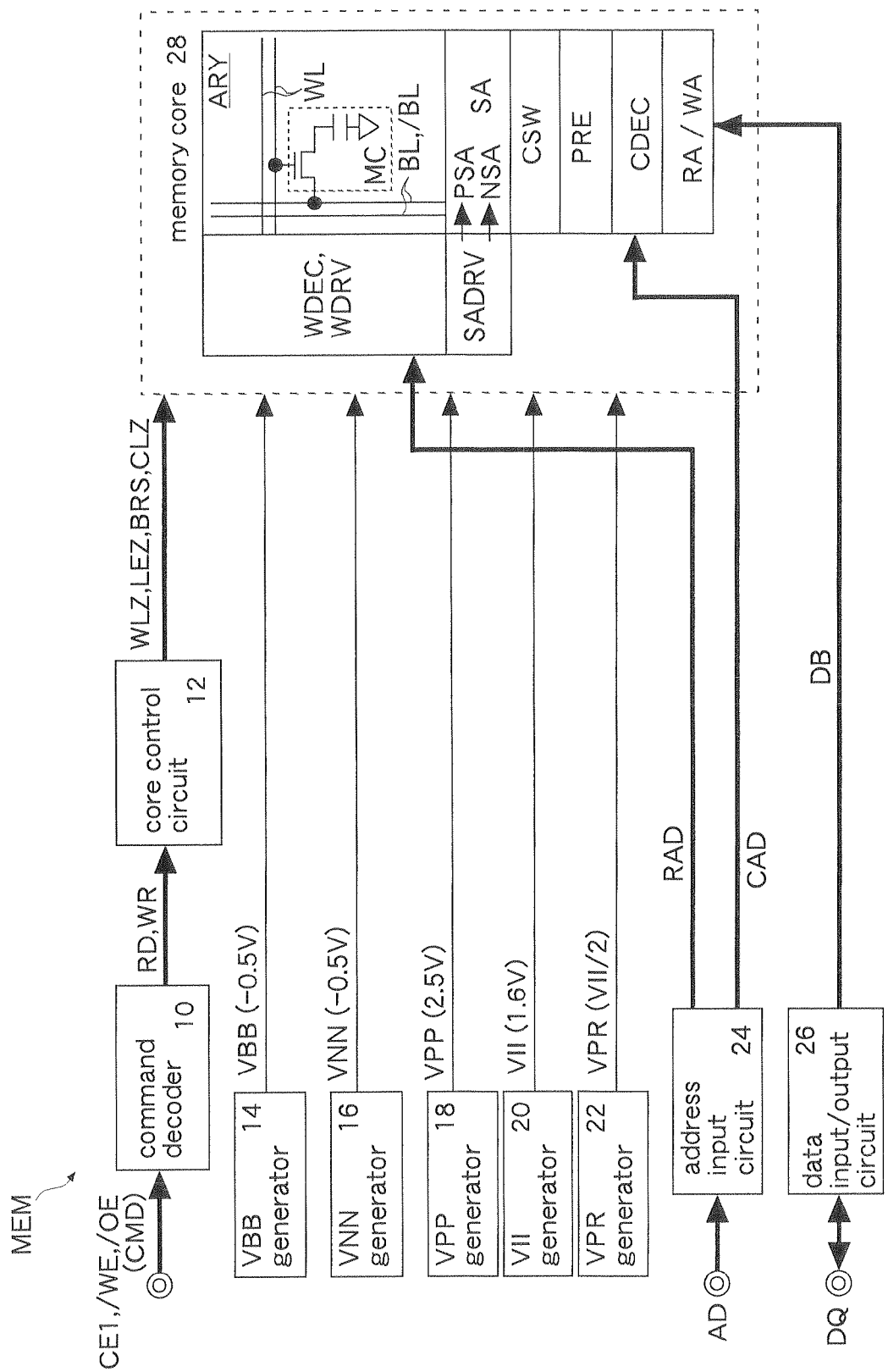
FIG. 1 is a block diagram showing a first embodiment of the present invention.

Hereinafter, embodiments of the present invention will be described, using the drawings. In the drawings, each signal line shown by the heavy line is constituted of a plurality of lines. Further, part of blocks to which the heavy lines are connected is constituted of a plurality of circuits. Each signal line through which the signal is transmitted is denoted by the same reference symbol as the signal name. Each signal starting with "/" represents negative logic. Each signal ending with "Z" represents positive logic. Each double circle in the drawings represents an external terminal.

FIG. 1 shows a first embodiment of the present invention. A semiconductor memory MEM is, for example, an FCRAM (Fast Cycle RAM). The FCRAM is a pseudo SRAM including DRAM memory cells and including an SRAM interface. The memory MEM includes a command decoder 10, a core control circuit 12, a VBB generator 14 (cell substrate voltage generator), a VNN generator 16 (negative voltage generator), a VPP generator 18, a VII generator 20, a VPR generator 22, an address input circuit 24, a data input/output circuit 26, and a memory core 28.

Although not particularly shown, the semiconductor memory MEM includes a redundancy circuit (redundancy memory cells, redundancy word lines, and a redundancy bit line pair) to relieve a failure memory cell or the like, a redundancy fuse circuit to make the redundancy circuit operational, and a redundancy control circuit. The redundancy fuse circuit stores a failure address. The redundancy control circuit detects that an address signal AD matches the failure address, disables access to a normal memory cell, and enables access to a redundancy memory cell. Further, the semiconductor memory MEM includes a refresh timer, a refresh address counter, and so on, which are not shown, to automatically perform a refresh operation. Since the present invention does not relate to control of the refresh operation of a memory cell, circuits and operations related to the refresh operation will not be described.

The command decoder 10 outputs commands CMD recognized according to logic levels of a chip enable signal CE1, a write enable signal /WE, and an output enable signal /OE as a read command RD, a write command WR, and so on to perform access operations to the memory core 28. The read command RD and the write command WR are access commands (access requests) to allow the memory core 28 to perform an access operation.

In response to the read command RD and the write command WR, the core control circuit 12 outputs a word line activation signal WLZ, a sense amplifier activation signal LEZ, a precharge control signal BRS, a column selection signal CLZ to allow the memory core 28 to perform a read operation and a write operation. The word line activation signal WLZ is a timing signal to control an activation timing of a word line WL. The sense amplifier activation signal LEZ is a timing signal to control an activation timing of a sense amplifier SA. The column selection signal CLZ is a timing signal to control an on-timing of a column switch CSW. The precharge control signal BRS is a timing signal to control on/off of a precharge circuit PRE.

The core control circuit 12 has a function of setting the precharge control signal BRS to a low logic level during a standby period when the memory cell MC is not accessed. Thanks to this function, during the standby period, a precharge voltage VPR is not supplied to bit lines BL, /BL, and the bit lines BL, /BL are set to a floating state. Therefore, even when a short failure occurs between the word line WL and the bit line BL (or /BL), a leak failure is prevented from occurring between a negative voltage line VNN to supply a low level voltage to the word line and a precharge voltage line VPR. Note, however, that when the short failure occurs between the word line WL and the bit line BL (or /BL), the voltage of the bit line BL (or /BL) gradually changes to a negative voltage VNN during the standby period.

The VBB generator 14 generates a substrate voltage VBB (for example, −0.5 V) of a memory cell array ARY. The substrate voltage VBB (cell substrate voltage) is supplied to a substrate of a transfer transistor (nMOS transistor) of the memory cell MC. The VNN generator 16 generates the low level voltage VNN (for example, −0.5 V; negative voltage) of the word line WL. In this embodiment, the low level voltage VNN is set to the same value as the substrate voltage VBB. Incidentally, the low level voltage VNN may be higher than the substrate voltage VBB. The VPP generator 18 generates a high level voltage VPP (for example, 2.5 V; boosted voltage) of the word line WL.

The VII generator 20 generates an internal power supply voltage VII (for example, 1.6 V) being a power supply voltage of main circuits of the memory MEM. The VPR generator 22 generates a precharge voltage VPR (for example, 0.8 V (VII/2)) of the bit line. The voltage generators 14, 16, 18, 20, 22 respectively generate the constant internal voltages VBB, VNN, VPP, VII, VPR which are independent of an external power supply voltage VDD and a change in the operating temperature of the memory MEM using the external power supply voltage VDD (not shown) supplied from outside the memory MEM.

The address input circuit 24 receives an address AD and outputs the received address as a row address RAD and a column address CAD. The row address RAD is used to select the word line WL described later. The column address CAD is used to select the bit lines BL, /BL.

The data input/output circuit 26 receives write data via a data terminal DQ and outputs the received data to a data bus DB. Further, the data input/output circuit 26 receives read data from the memory cell MC via the data bus DB and outputs the received data to the data terminal DQ.

The memory core 28 includes the memory cell array ARY, a word decoder WDEC, a word driver WDRV, a sense amplifier driver SRDRV, the sense amplifier SA, the column switch CSW, the precharge circuit PRE, a column decoder CDEC, a read amplifier RA, and a write amplifier WA. The memory cell array ARY includes plural dynamic memory cells MC, word lines WL connected to the memory cells MC arranged in one direction, and bit lines BL, /BL connected to the memory cells MC arranged in a direction perpendicular to the one direction. The memory cell MC includes a capacitor to hold data as an electric charge and a transfer transistor one and the other of a drain/source of which are connected to the bit line BL (or /BL) and the capacitor (data memory part), respectively. The other end of the capacitor is connected to the precharge voltage line VPR or a plate voltage line VCP not shown. A gate of the transfer transistor is connected to the word line WL. The read operation and the write operation are performed by selecting the word line WL.

The word decoder WDEC decodes the row address RAD to select any of the word lines WL. When the memory cell MC is accessed, in response to a decode signal outputted from the word decoder WDEC, the word driver WDRV supplies the high level voltage VPP to the word line WL in synchronization with the word line activation signal WLZ. The word driver WDRV supplies the low level voltage VNN to the word line WL when the memory cell MC is not accessed. The sense amplifier driver SADRV activates sense amplifier activation signals PSA, NSA in synchronization with the sense amplifier activation signal LEZ. The sense amplifier SA operates in synchronization with the sense amplifier activation signals PSA, NSA and amplifies a difference between signal amounts of data read to the bit line pair BL, /BL.

The column switch CSW is selectively turned on according to the column address CAD, and connects the bit lines BL, /BL corresponding to the column address CAD to the read amplifier RA and the write amplifier WA. The precharge circuit PRE supplies the precharge voltage to the bit lines BL, /BL according to the precharge control signal BRS. The column address decoder CDEC decodes the column address CAD to select the bit line pair BL, /BL to/from which data DQ is inputted/outputted. The read amplifier RA amplifies complementary read data outputted via the column switch CSW in a read access operation. The write amplifier WA amplifies complementary write data supplied via the data bus DB and supplies it to the bit line pair BL, /BL in a write access operation.

Figure 2:
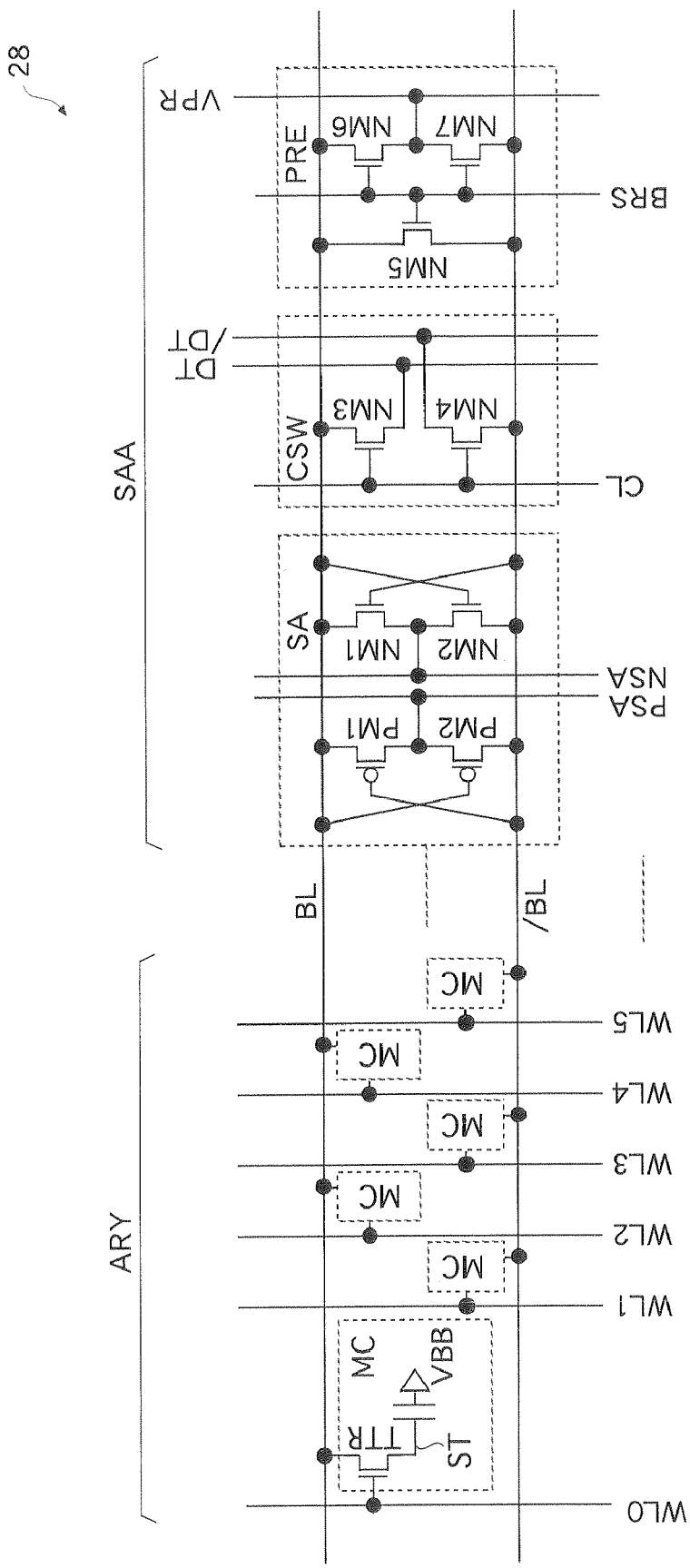
FIG. 2 is a circuit diagram showing details of a memory core shown in FIG. 1.

FIG. 2 shows details of the memory core 28 shown in FIG. 1. The word line WL (WL0, WL1, WL2, . . . ) is connected to one of the bit line pair BL, /BL via the memory cell MC and further connected to the sense amplifier SA and so on via the bit line BL, /BL. A transfer transistor TTR of each memory cell MC connects its gate to the word line WL and connects one and the other of its source/drain to the bit line BL (or /BL) and a storage node ST.

The sense amplifier SA is constituted of a pair of CMOS inverters whose inputs and outputs are mutually connected. One CMOS inverter is constituted of a pMOS transistor PM1 and an nMOS transistor NM1. The other CMOS inverter is constituted of a pMOS transistor PM2 and an nMOS transistor NM2. Hereinafter, the pMOS transistor and the nMOS transistor are referred to only as the pMOS and the nMOS or the transistor. The transistor PM1 connects its gate to the bit line /BL, connects its drain to the bit line BL, and receives the sense amplifier activation signal PSA at its source. The transistor NM1 connects its gate to the bit line /BL, connects its drain to the bit line BL, and receives the sense amplifier activation signal NSA at its source. The transistor PM2 connects its gate to the bit line BL, connects its drain to the bit line /BL, and receives the sense amplifier activation signal PSA at its source. The transistor NM2 connects its gate to the bit line BL, connects its drain to the bit line /BL, and receives the sense amplifier activation signal NSA at its source. The sense amplifier activation signals PSA, NSA are activated in synchronization with activation of the sense amplifier activation signal LEZ.

The column switch CSW is constituted of an nMOS transistor NM3 which connects the bit line BL to a data line DT and an nMOS transistor NM4 which connects the bit line /BL to a data line /DT. Gates of the respective transistors NM3, NM4 receive a column selection signal CL. The column selection signal CL is activated in synchronization with the column selection signal CLZ. In the read operation, read data signals on the bit lines BL, /BL amplified by the sense amplifier SA are transmitted to the data lines DT, /DT via the column switch CSW. In the write operation, write data signals supplied via the data lines DT, /DT are written into the memory cell MC via the bit lines BL, /BL. The data lines DT, /DT are connected to the read amplifier RA and the write amplifier WA.

The precharge circuit PRE is constituted of an nMOS transistor NM5 to connect the bit lines BL, /BL to each other and a pair of nMOS transistors NM6, NM7 to connect the complementary bit lines BL, /BL to the precharge voltage line VPR, respectively (precharge switch). Gates of the transistors NM5, NM6, NM7 receive the precharge control signal BRS. While receiving the precharge control signal BRS at a high logic level, the precharge circuit PRE supplies the precharge voltage VPR to the bit lines BL, /BL and also equalizes the voltages of the bit lines BL, /BL.

The sense amplifier SA, the column switch CSW, and the precharge circuit PRE are formed in a sense amplifier area SAA. The sense amplifier area SAA includes one n-well region (substrate; n-well in FIG. 3) where the pMOS is formed and one p-well region (substrate; p-well in FIG. 3) where the nMOS is formed. Moreover, a memory cell array ARY forming area includes one p-well region independent of the sense amplifier area SAA.

Figure 3:
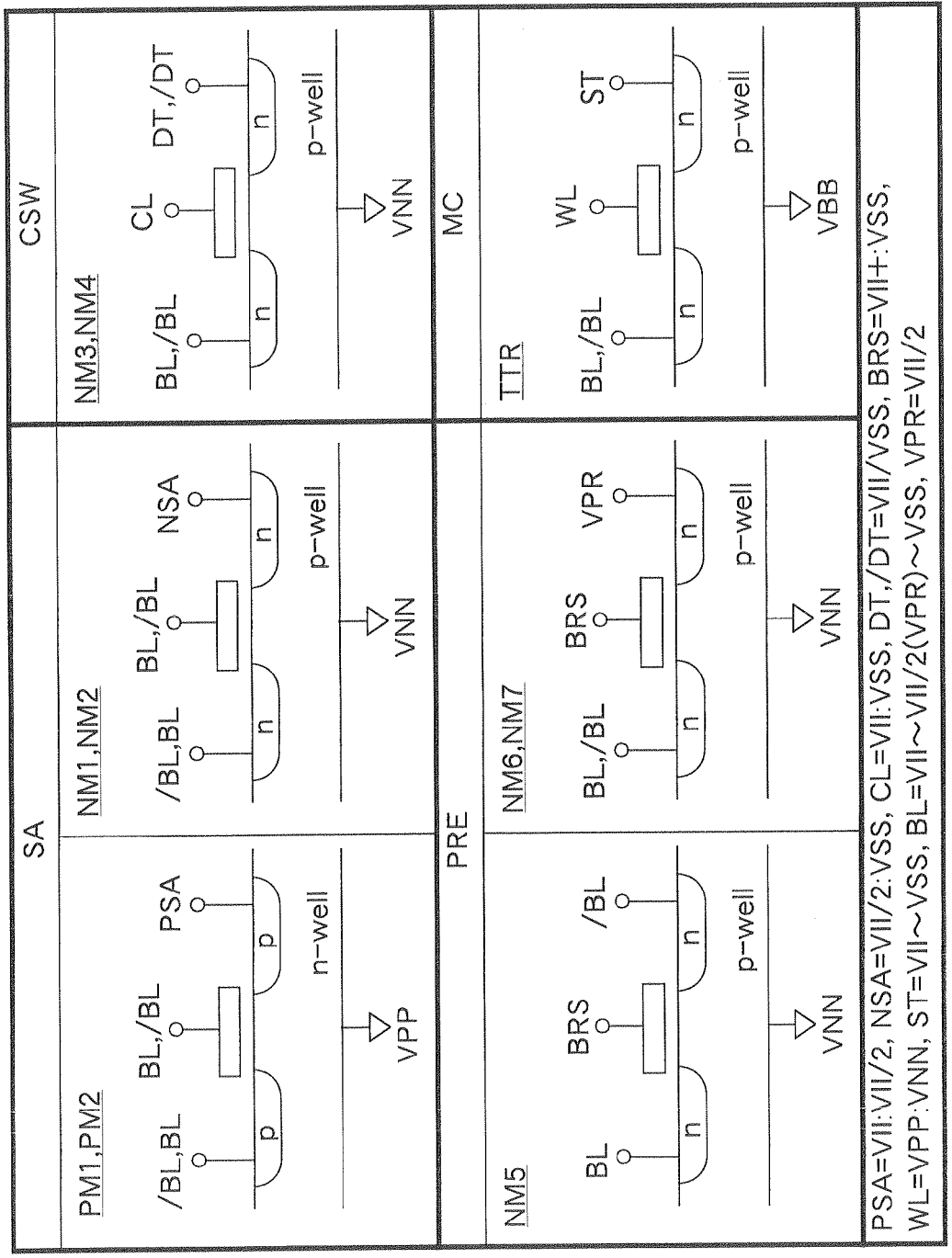
FIG. 3 is an explanatory diagram showing states of transistors shown in FIG. 2.

FIG. 3 shows states of the transistors shown in FIG. 2. The substrate voltage of the pMOS transistor PM1-2 (voltage of n-well) of the sense amplifier SA is set to the high level voltage VPP of the word line WL. Therefore, even when a short failure occurs between the word line WL and the bit line BL (or /BL) and at the worst the voltage of the bit line BL (or /BL) changes to the high level voltage VPP of the word line WL, a substrate current (leak current) can be prevented from flowing between the drain of the transistor PM1-2 (BL or /BL) and the substrate n-well.

The substrate voltage of the nMOS transistor NM1-2 (voltage of p-well) of the sense amplifier SA is set to the low level voltage VNN of the word line WL. Therefore, even when the short failure occurs between the word line WL and the bit line BL (or /BL) and the voltage of the bit line BL (or /BL) changes to the low level voltage VNN of the word line WL during the standby period, the substrate current (leak current) can be prevented from flowing between the drain of the transistor NM1-2 (BL or /BL) and the substrate p-well.

Similarly, the substrate voltages (voltage of p-well) of the nMOS transistor NM3-4 of the column switch CSW and the nMOS transistor NM5-7 of the precharge circuit PRE are set to the low level voltage VNN. Therefore, even when the voltage of the bit line BL (or /BL) changes to the low level voltage VNN during the standby period due to the above short failure, the substrate current (leak current) can be prevented from flowing between the drain of the transistor NM3-7 (BL or /BL) and the substrate p-well.

Further, the substrate voltage (voltage of p-well) of the transfer transistor TTR (nMOS) of the memory cell MC is set to the substrate voltage VBB. The substrate voltage VBB is set to the same value as the low level voltage VNN. Therefore, even when the voltage of the bit line BL (or /BL) changes to the low level voltage VNN during the standby period due to the above short failure, the substrate current (leak current) can be prevented from flowing between one of the source/drain of the transfer transistor TTR (BL or /BL) and the substrate p-well.

Incidentally, the high level voltage and low level voltage of the sense amplifier activation signal PSA are the internal power supply voltage VII and VII/2. The high level voltage and low level voltage of the sense amplifier activation signal NSA are VII/2 and a ground voltage VSS. The high level voltage and low level voltage of the column selection signal CLZ are the internal power supply voltage VII and the ground voltage VSS. The high level voltages and low level voltages of the data lines DT, /DT are the internal power supply voltage VII and the ground voltage VSS. The high level voltage and low level voltage of the precharge control signal BRS are, for example, a voltage (VII+) slightly higher then the internal power supply voltage VII and the ground voltage VSS. The high level voltage and lower level voltage of the word line WL are the boosted voltage VPP and the negative voltage VNN. The voltage of the storage node ST of the memory cell MC and the voltages of the bit lines BL, /BL change between the internal power supply voltage VII and the ground voltage VSS. Note, however, that the voltages of the bit lines BL, /BL are set to the precharge voltage VPR immediately before and immediately after the memory cell MC is accessed. The value of the precharge voltage VPR is VII/2.

Figure 4:
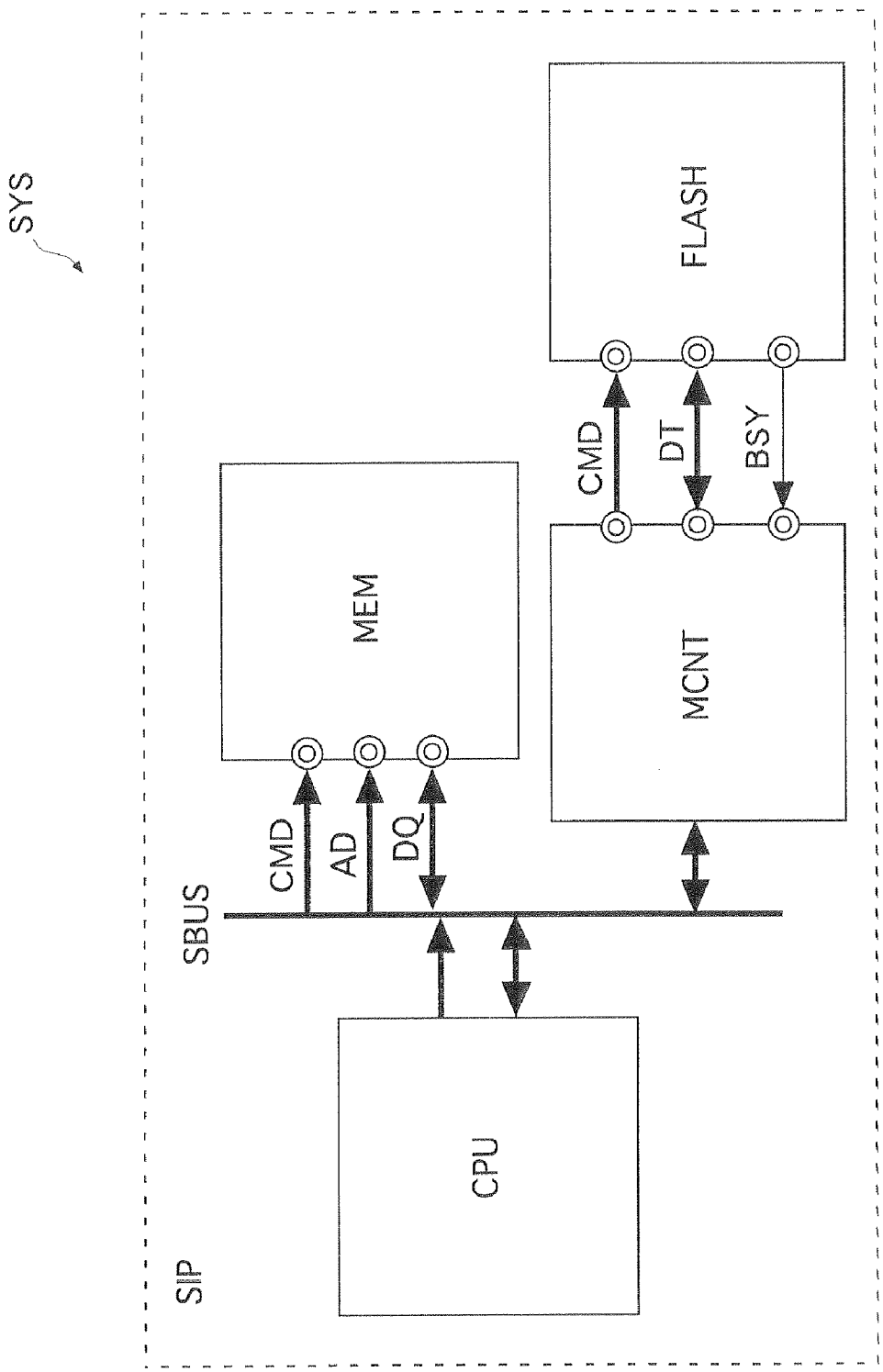
FIG. 4 is a block diagram showing a system of the first embodiment.

FIG. 4 shows a system of the first embodiment. Incidentally, also in a second to eleventh embodiments described later, the same system as in FIG. 4 is constituted. The system is formed, for example, as a system in package SIP integrated on a silicon substrate. The SIP includes the memory MEM shown in FIG. 1, a flash memory FLASH, a memory controller MCNT which accesses the flash memory FLASH, and a CPU (controller) which controls the entire system. The CPU, the memory MEM, and the memory controller MCNT are connected to one another by a system bus SBUS. The SIP may be connected to a higher level system via an external bus. To access the memory MEM, the CPU outputs a command signal CMD, an address signal AD, and a write data signal DQ and receives a read data signal DQ from the memory MEM.

Figure 5:
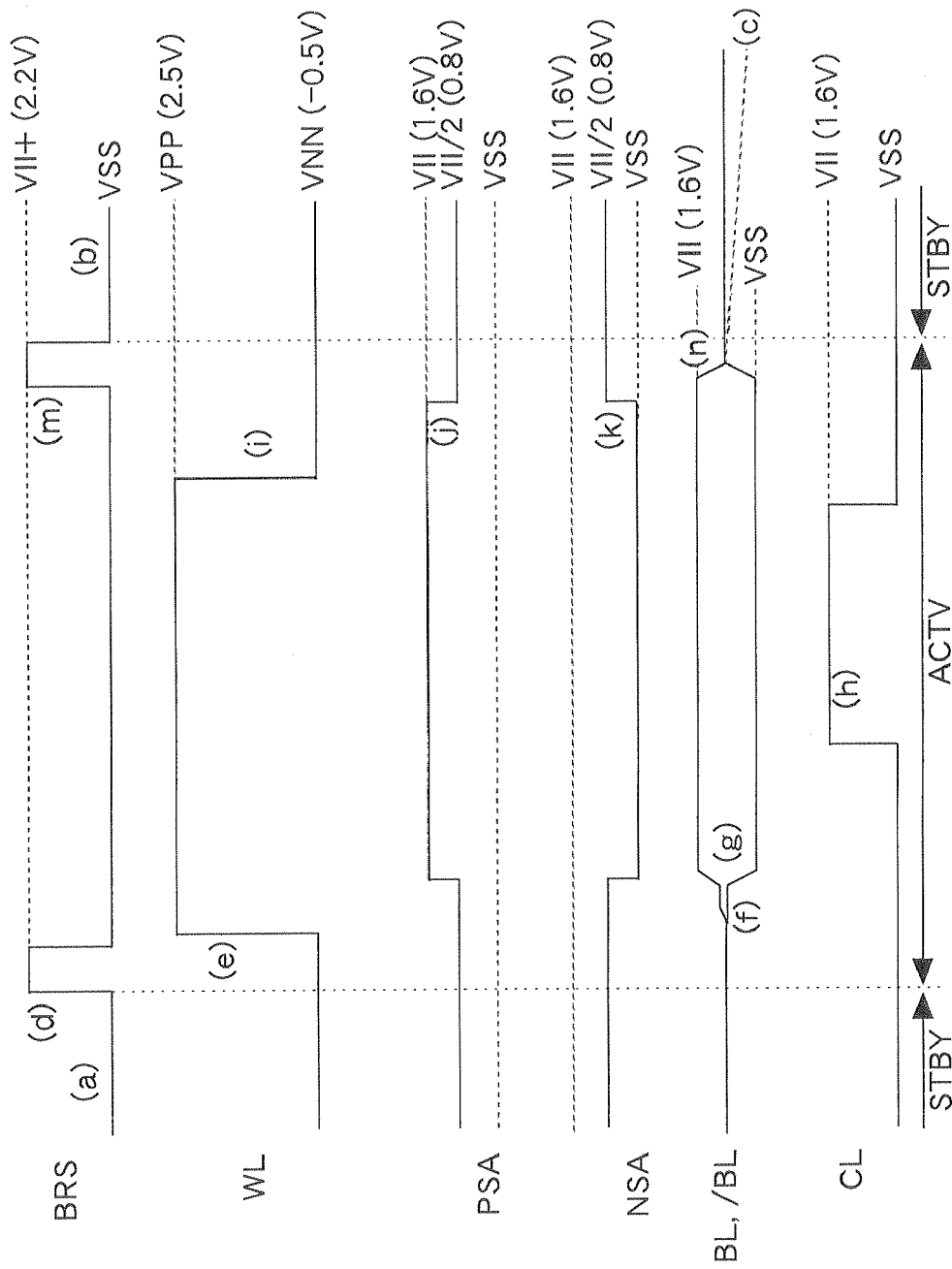
FIG. 5 is a timing chart showing an access operation of a memory of the first embodiment.

FIG. 5 shows the access operation of the memory MEM of the first embodiment. Here, a period when the memory cell MC is accessed is referred to as an active period ACTV, and a period other than the active period ACTV is referred to as a standby period STBY. During the active period ACTV, any of the read operation, the write operation and a self refresh operation is performed. Incidentally, in the refresh operation, the column selection signal CL holds the low level voltage VSS.

The core control circuit 12 shown in FIG. 1 sets the precharge control signal BRS to the low level voltage VSS during the standby period STBY (FIG. 5(a, b)). Namely, the core control circuit 12 operates as a precharge control circuit which turns off the transistors NM5-7 (precharge switch) of the precharge circuit PRE during the standby period. Turning off the transistors NM5-NM7 can prevent the bit lines BL, /BL and the precharge voltage line VPR from being connected via the precharge circuit PRE during the standby period STBY. In other words, during the standby period STBY when the memory cell MC is not accessed, the capacity to supply the precharge voltage VPR to the bit lines BL, /BL lowers. Since the bit lines BL, /BL are set to the floating state, if the leak failure exists between the word line WL and the bit line BL, /BL, the voltage of the bit line BL, /BL gradually decreases to the low level voltage VNN of the word line WL (a dotted line (c) in FIG. 5).

The precharge control signal BRS is set to the high level voltage VII+ only for a predetermined period immediately before the word line WL is activated to the high level voltage VPP (FIG. 5(d)). Thus, the bit lines BL, /BL are set to the precharge voltage VPR.

In response to the access command RD, WR or a refresh request, the word line WL is activated to the high level voltage VPP (FIG. 5(e)), and data is read from the memory cell MC to one of the bit lines BL, /BL (FIG. 5(f)). Then, the sense amplifier activation signals PSA, NSA are activated to the high level voltage VII and the low level voltage VSS, respectively, and a voltage difference between the bit lines BL, /BL is amplified (FIG. 5(g)). While the sense amplifier SA is operating, the column selection signal CL changes to the high level voltage VII, and data on the bit lines BL, /BL are read to the data lines DT, /DT (FIG. 5(h)).

Then, the word line WL is inactivated (FIG. 5(i)), and the sense amplifier activation signals PSA, NSA are inactivated (FIG. 5(j, k)). After this, the precharge control signal BRS is temporarily set to the high level voltage VII+ (FIG. 5(m)). Thereby, the voltages of the bit lines BL, /BL are reset to the precharge voltage VPR (FIG. 5(n)). Then, the access operation is completed.

As described above, the voltages of the bit lines BL, /BL gradually decrease to the low level voltage VNN of the word line WL during the standby period STBY. However, as shown in FIG. 3, the substrate voltages of the transistors NM1-7, TTR connected to the bit line BL (or /BL) are set to the same negative voltage as the low level voltage VNN of the word line WL. This can prevent the substrate current from flowing to the transistors NM1-7, TTR. Further, during the standby period STBY, the transistors NM5-7 of the precharge circuit PRE are turned off. This can prevent the leak current from flowing between the word line WL and the precharge voltage line VPR. As a result, an increase in standby current can be certainly prevented.

As described above, in the first embodiment, even when the short failure occurs between the word line WL and the bit line BL, /BL and the voltage of the bit line BL, /BL changes to the low level voltage VNN of the word line WL during the standby period STBY, the substrate current can be prevented from flowing to the transistors NM1-NM7, TTR and the transistors PM1-PM2.

Figure 6:
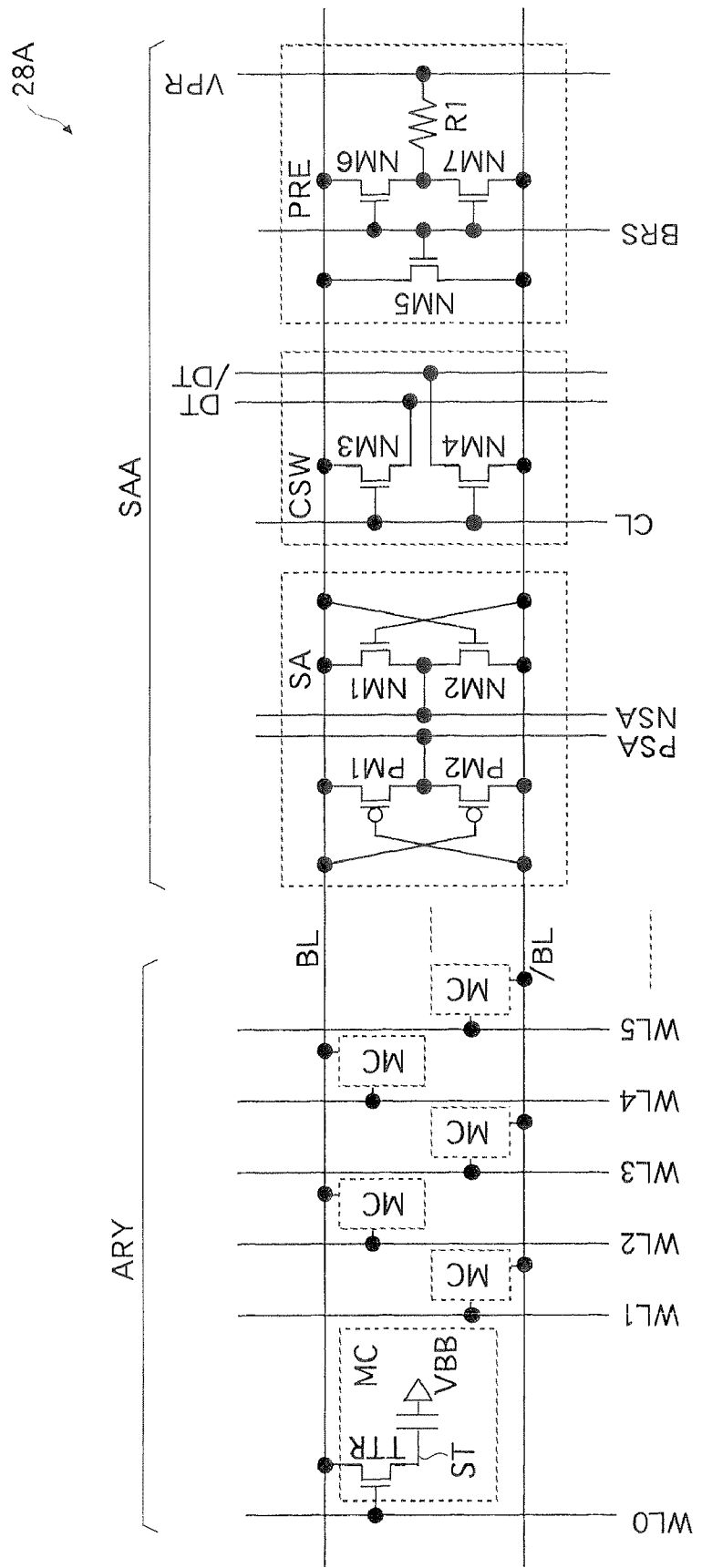
FIG. 6 is a circuit diagram showing a memory core of a second embodiment of the present invention.

FIG. 6 shows a memory core 28A of a second embodiment of the present invention. The same symbols are used to designate the same elements as those described in the first embodiment, and a detailed description thereof is omitted. A semiconductor memory of this embodiment includes the memory core 28A instead of the memory core 28 of the first embodiment. The other constitutions are the same as in the first embodiment.

Only the precharge circuit PRE of the memory core 28A is different from that of the first embodiment. The precharge circuit PRE is constituted by adding a resistor element R1 between sources of the nMOS transistors NM6, NM7 and the precharge voltage line VPR. By the resistor element R1, the capacity to supply the precharge voltage VPR to the bit lines BL, /BL is lowered, compared to the precharge circuit PRE of the first embodiment. Therefore, even when the short failure occurs between the word line WL and the bit line BL (or /BL), the leakage current amount between the negative voltage line VNN which supplies the low level voltage to the word line WL and the precharge voltage line VPR can be reduced.

Accordingly, the probability that the voltage of the bit line BL, /BL decreases to the negative voltage VNN during the standby period STBY can be reduced.

In the semiconductor memory of this embodiment, operations during the standby period STBY and the active period ACTV are the same as those in FIG. 5. The substrate voltages of the transistors NM1-7, TTR are set to the low level voltage VNN of the word line WL as shown in FIG. 3. The substrate voltages of the transistors PM1-PM2 are set to the high level voltage VPP of the word line WL as shown in FIG. 3. Therefore, even when the short failure occurs between the word line WL and the bit line BL (or /BL), the substrate current can be prevented from flowing to the transistors PM1-2, NM1-NM7, and TTR, which can certainly prevent an increase in standby current. As described above, also in the second embodiment, the same effect as in the above first embodiment can be obtained.

Figure 7:
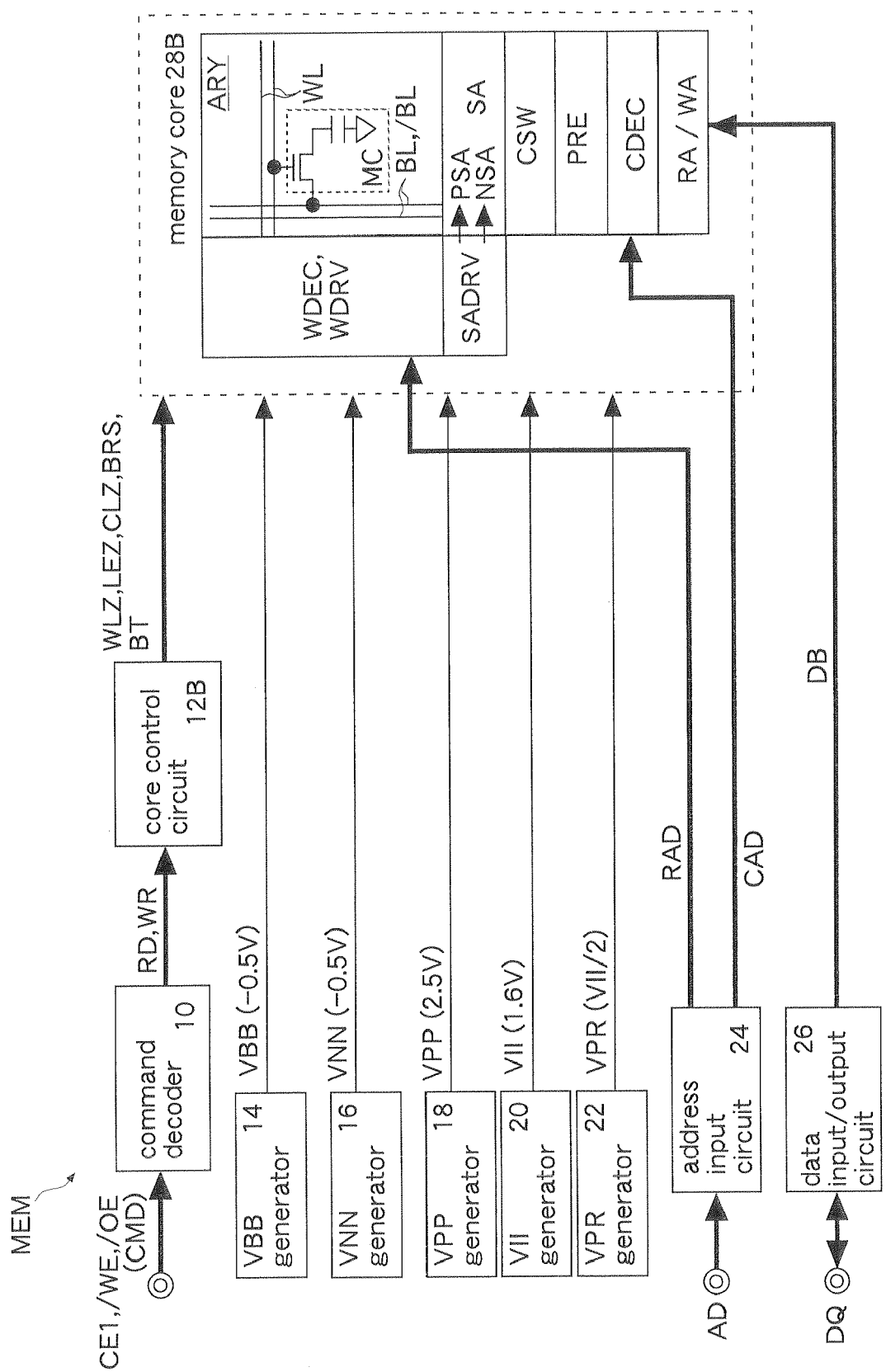
FIG. 7 is a block diagram showing a third embodiment of the present invention.

FIG. 7 shows a third embodiment of the present invention. The same symbols are used to designate the same elements as those described in the first embodiment, and a detailed description thereof is omitted. A semiconductor memory MEM (FCRAM) of this embodiment includes a core control circuit 12B and a memory core 28B instead of the core control circuit 12 and the memory core 28 of the first embodiment. The other constitutions are the same as in the first embodiment.

The core control circuit 12B is constituted by adding a function of generating a switch control signal BT to the core control circuit 12 of the first embodiment. The switch control signal BT controls the operation of a connection switch BT shown in FIG. 8. The core control circuit 12B operates as a connection control circuit which turns off the connection switch BT during the standby period STBY. The memory cell array ARY of the memory core 28B includes plural memory blocks MBLK (such as MBLK1-2). The other constitutions are the same as those of the memory core 28 of the first embodiment.

Figure 8:
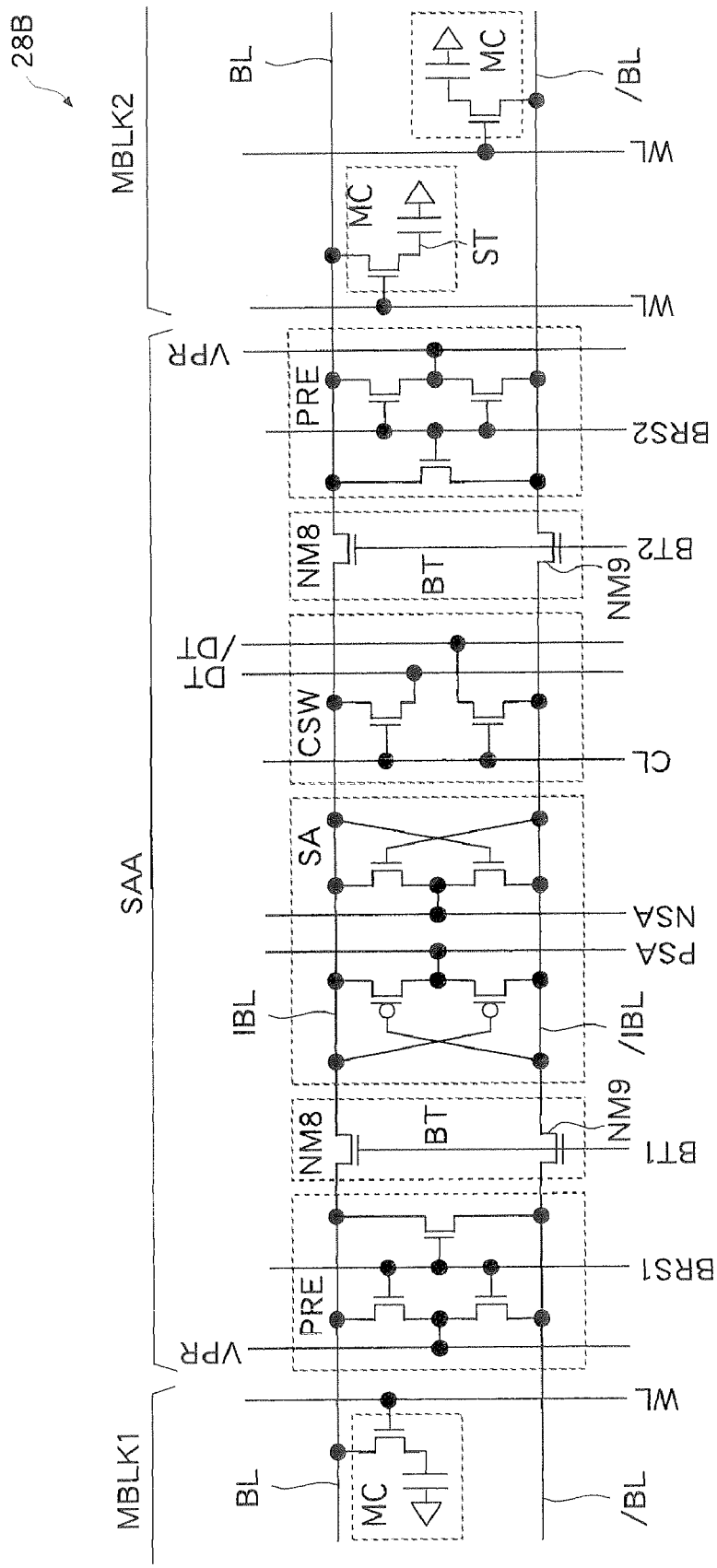
FIG. 8 is a circuit diagram showing details of a memory core shown in FIG. 7.

FIG. 8 shows details of the memory core 28B shown in FIG. 7. A detailed description of the same constitutions as in FIG. 2 described above is omitted. In this embodiment, the precharge circuit PRE is formed in each memory block MBLK1-2. The sense amplifier SA and the column switch CSW are shared between a pair of memory blocks MBLK1-2 (a shared sense amplifier system). To this end, the bit line pair BL, /BL of each memory block MBLK1-2 is connected to the sense amplifier SA and the column switch CSW via the connection switch BT. While receiving a switch control signal BT (BT1 or BT2) of a high level voltage, the connection switch BT connects the bit lines BL, /BL of the memory block MBLK to the sense amplifier SA and the column switch CSW. The precharge circuits PRE and the connection switches BT corresponding to the respective memory blocks MBLK1-2 operate at timings different from each other and thereby receive different precharge control signals BRS1, BRS2 and switch control signals BT1, BT2.

The connection switch BT is constituted of a pair of nMOS transistors NM8, NM9. One of a source/drain of the nMOS transistor NM8-9 is connected to the bit line BL (or /BL), and the other of the source/drain of the nMOS transistor NM8-9 is connected to an internal bit line IBL (or /IBL). A gate of the nMOS transistor NM8-9 receives the switch control signal BT (BT1, BT2).

Although not particularly shown, the substrate voltage (voltage of p-well) of the nMOS transistor NM8-9 is set to the low level voltage VNN of the word line WL. Therefore, even when the short failure occurs between the word line WL and the bit line BL (or /BL) and the voltage of the bit line BL (/BL) changes to the low level voltage VNN of the word line WL during the standby period, the substrate current (leak current) can be prevented from flowing between the drain of the transistor NM8-9 (BL or /BL) and the substrate p-well.

States of the substrate voltages and so on of the transistors of the precharge circuit PRE, the sense amplifier SA, the column switch CSW, and the memory cell MC are the same as those in the first embodiment (FIG. 3). Incidentally, in this embodiment, since the connection switch BT is turned off during the standby period STBY, the voltages of the internal bit lines IBL, /IBL do not decrease to the low level voltage VNN of the word line WL during the standby period STBY. Hence, the substrate voltages of the nMOS transistors NM1-4 of the sense amplifier SA and the column switch CSW may be set, for example, to the ground voltage VSS.

Figure 9:
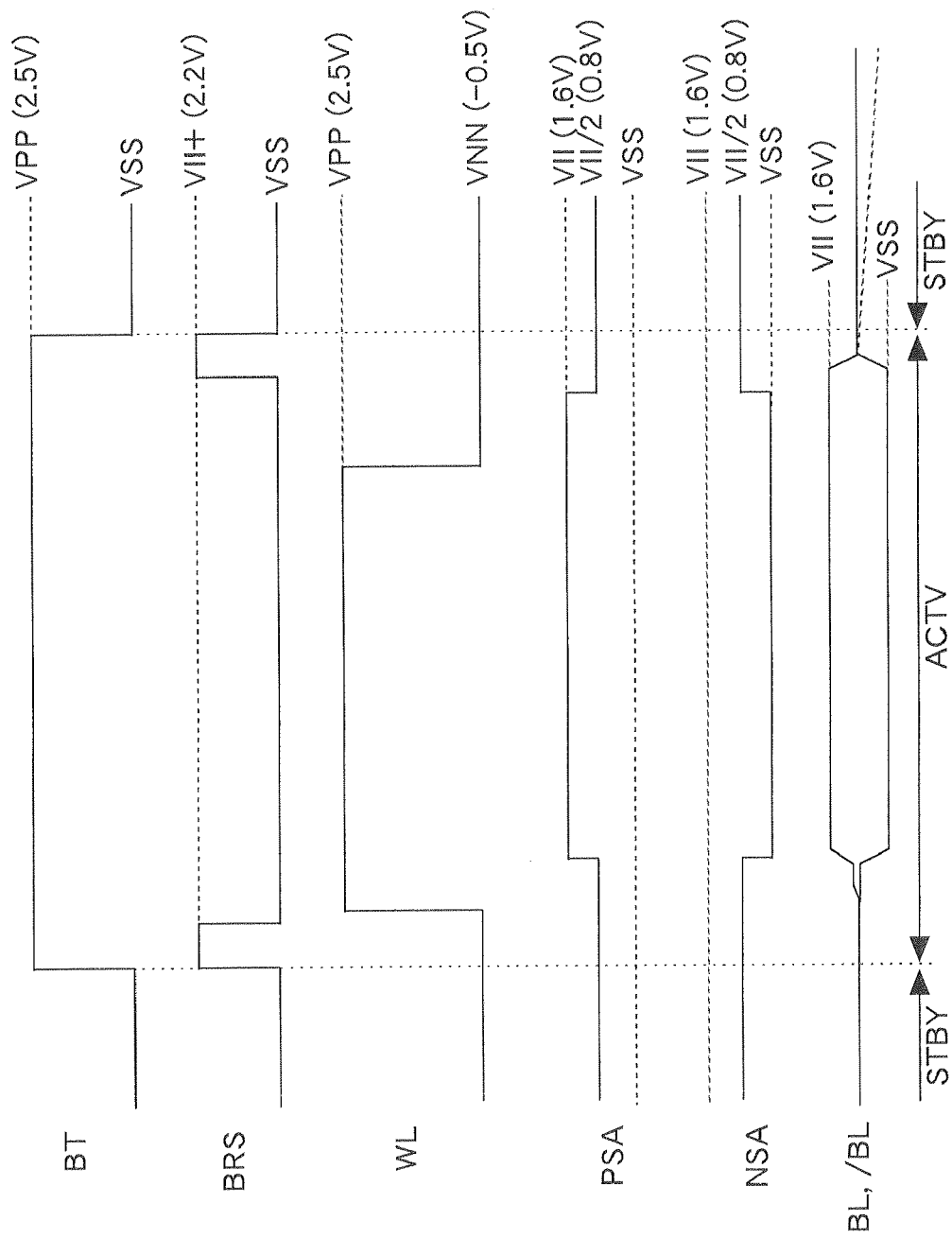
FIG. 9 is a timing chart showing an access operation of a memory of the third embodiment.

FIG. 9 shows an access operation of the semiconductor memory of the third embodiment. In this embodiment, compared to the first embodiment (FIG. 5), a waveform of the switch control signal BT which operates the connection switch BT is added. Waveforms of the other signals are the same as those in FIG. 5. The switch control signal BT corresponding to the memory block MBLK to be accessed is set to the high level voltage VPP (for example, 2.5 V) only during the active period ACTV, and set to the low level voltage VSS during the standby period STBY. Incidentally, the switch control signal BT and the precharge control signal BRS corresponding to the memory block MBLK not to be accessed is held at the low level voltage VSS.

As described above, also in the third embodiment, the same effect as in the above first embodiment can be obtained. Further, also in the semiconductor memory which includes the connection switch BT and adopts the shared sense amplifier system, the substrate current can be prevented from flowing to the nMOS transistors connected to the bit lines BL, /BL. As a result, an increase in standby current can be certainly prevented.

Figure 10:
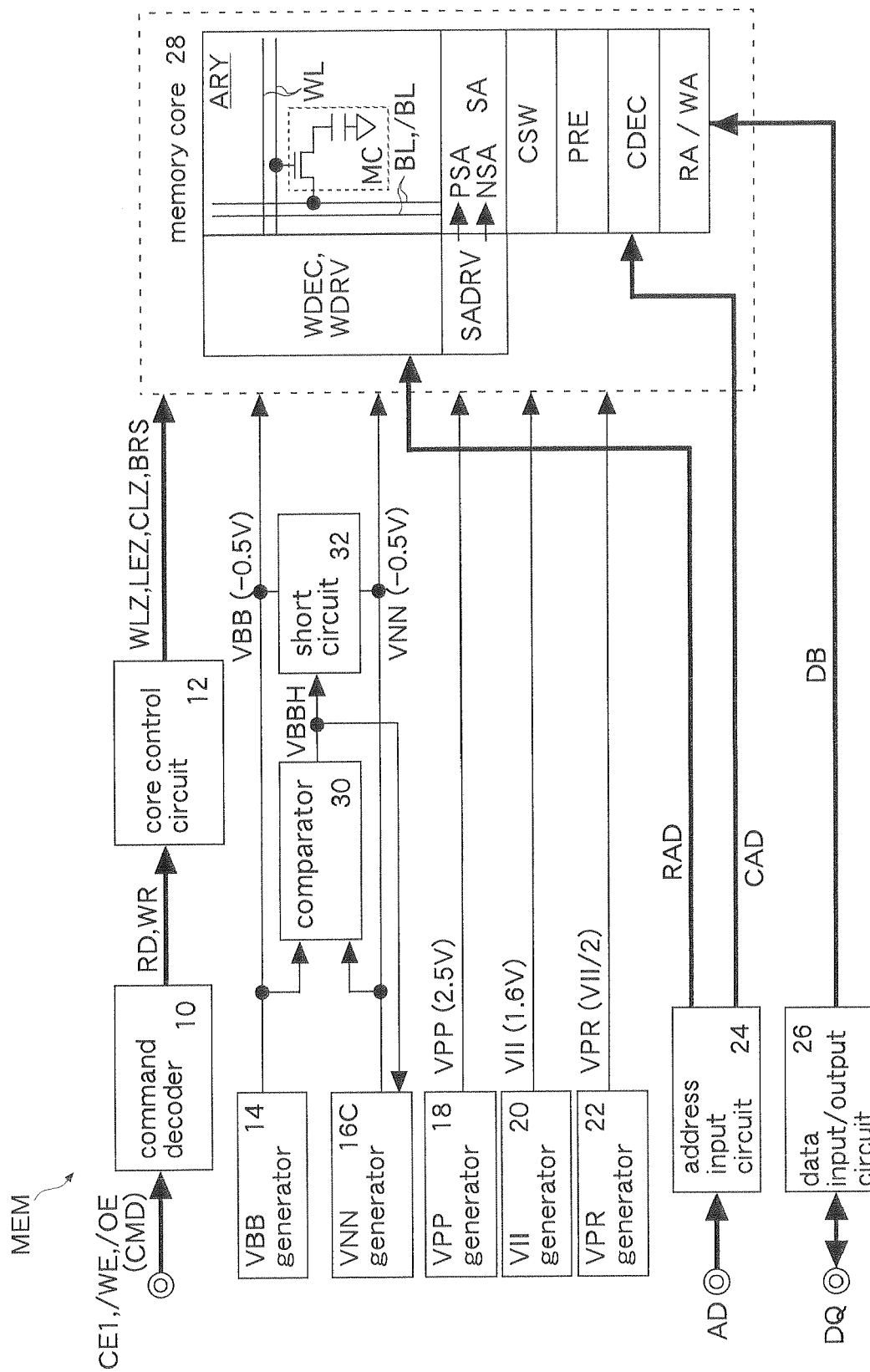
FIG. 10 is a block diagram showing a fourth embodiment of the present invention.

FIG. 10 shows a fourth embodiment of the present invention. The same symbols are used to designate the same elements as those described in the first embodiment, and a detailed description thereof is omitted. In this embodiment, a VNN generator 16C is formed instead of the VNN generator 16 of the first embodiment. Further, a comparator 30 and a short circuit 32 are added to the memory MEM of the first embodiment. The other constitutions are the same as in the first embodiment.

The comparator 30 compares the substrate voltage VBB and the negative voltage VNN and activates a detection signal VBBH to a high logic level when the substrate voltage VBB is higher than the negative voltage VNN. The short circuit 32 shorts the substrate voltage line VBB and the negative voltage line VNN when the detection signal VBBH is at the high logic level. The short circuit 32 disconnects the substrate voltage line VBB and the negative voltage line VNN when the detection signal VBBH is at a low logic level. The VCC generator 16C generates the negative voltage VNN when the detection signal VBBH is at the low logic level and stops the operation of generating the negative voltage VNN when the detection signal VBBH is at the high logic level.

Consequently, when the substrate voltage VBB becomes higher than the negative voltage VNN, the negative voltage becomes the same value as the substrate voltage VBB. Accordingly, the substrate current can be prevented from flowing to the transfer transistor TTR of the memory cell MC.

As described above, also in the fourth embodiment, the same effect as in the above first embodiment can be obtained. Further, even when the substrate voltage VBB becomes higher than the negative voltage VNN due to a difference in threshold voltage or the like between transistors constituting the VBB generator 14 and the VNN generator 16C, the substrate current can be prevented from flowing to the transfer transistor TTR of the memory cell MC. As a result, an increase in standby current can be certainly prevented.

Figure 11:
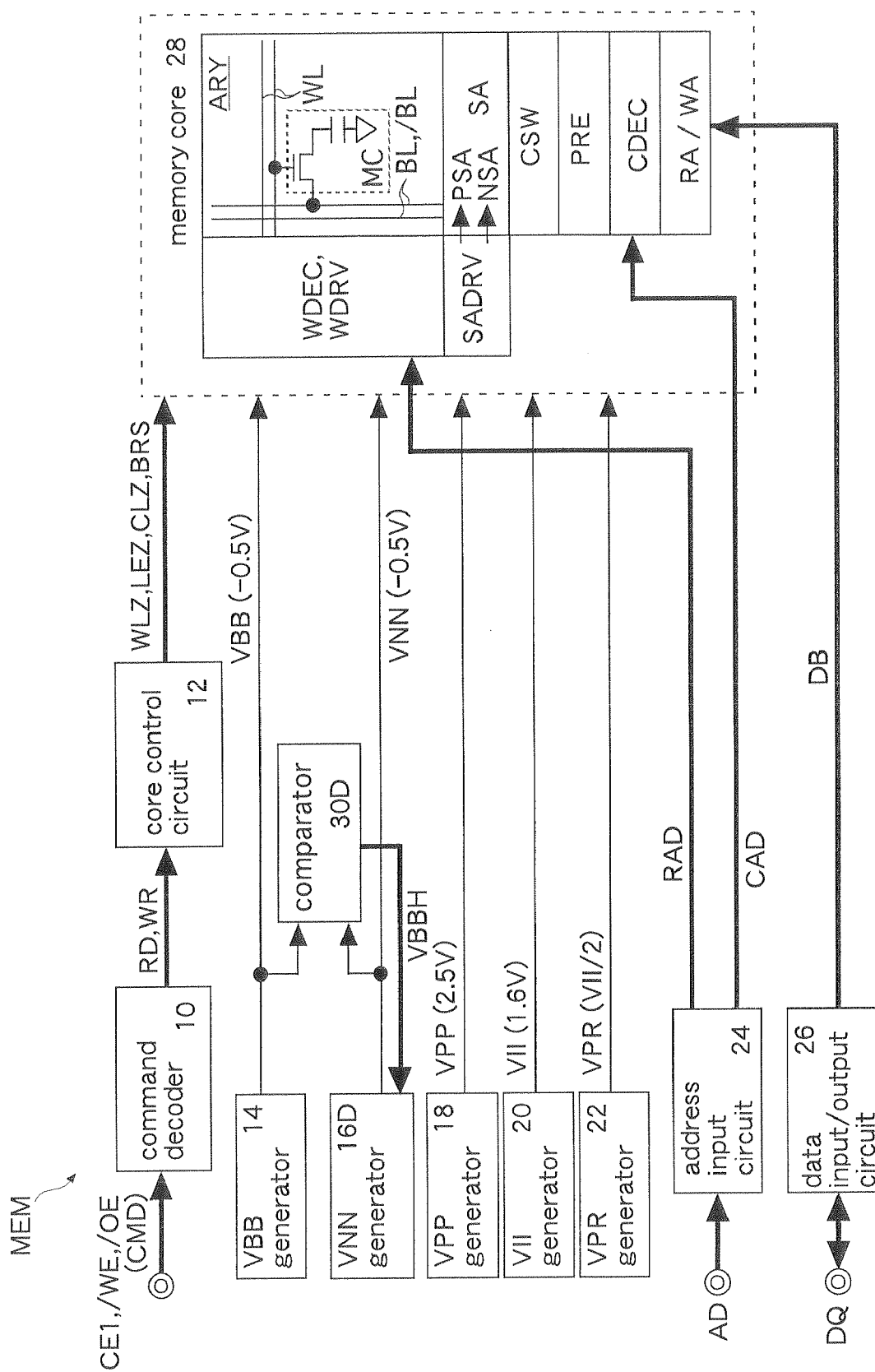
FIG. 11 is a block diagram showing a fifth embodiment of the present invention.

FIG. 11 shows a fifth embodiment of the present invention. The same symbols are used to designate the same elements as those described in the first and fourth embodiments, and a detailed description thereof is omitted. In this embodiment, a VNN generator 16D and a comparator 30D are formed instead of the VNN generator 16C and the comparator 30 of the fourth embodiment. Further, the short circuit 32 of the fourth embodiment is eliminated. The other constitutions are the same as in the fourth embodiment.

The comparator 30D compares the substrate voltage VBB and the negative voltage VNN and generates plural bits of detection signal VBBH according to a voltage difference therebetween. For example, the detection signal VBBH is constituted of two bits. When the substrate voltage VBB is lower than the negative voltage VNN, the value of the detection signal is set to "00". When the substrate voltage VBB is higher than the negative voltage VNN, the value of the detection signal VBBH changes to "01", "10", "11" as the difference therebetween becomes larger.

The VNN generator 16D has a switching control function of adjusting the value of the negative voltage VNN according to the value of the detection signal VBBH. As the value of the detection signal VBBH increases, the VNN generator 16D gradually increases the value of the negative voltage VNN generated. Since the negative voltage VNN increases, the substrate voltage VBB is set to the negative voltage VNN or lower. Accordingly, the substrate current can be prevented from flowing to the transfer transistor TTR of the memory cell MC. As described above, also in the fifth embodiment, the same effects as in the above first and fourth embodiments can be obtained.

Figure 12:
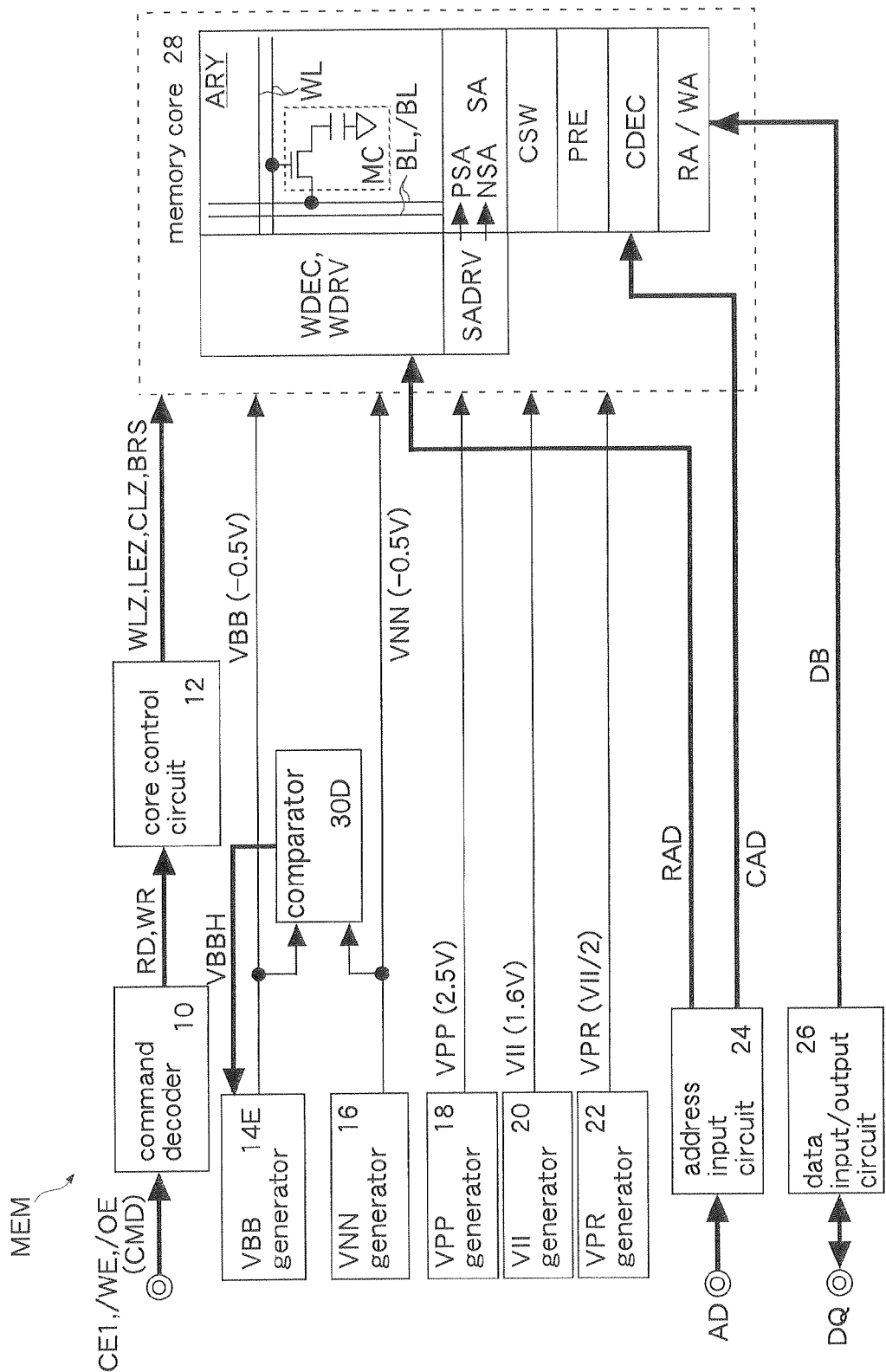
FIG. 12 is a block diagram showing a sixth embodiment of the present invention.

FIG. 12 shows a sixth embodiment of the present invention. The same symbols are used to designate the same elements as those described in the first, fourth, and fifth embodiments, and a detailed description thereof is omitted. In this embodiment, a VBB generator 14E and the VNN generator 16 are formed instead of the VBB generator 14 and the VNN generator 16D of the fifth embodiment. The other constitutions are the same as in the first embodiment.

The VBB generator 14E has a switching control function of adjusting the value of the substrate voltage VBB according to the value of the detection signal VBBH. As the value of the detection signal VBBH increases, the VBB generator 14E gradually decreases the value of the substrate voltage VBB generated. Hence, the substrate voltage VBB is set to the negative voltage VNN or lower. Accordingly, the substrate current can be prevented from flowing to the transfer transistor TTR of the memory cell MC. As described above, also in the sixth embodiment, the same effects as in the above first, fourth, and fifth embodiments can be obtained.

Figure 13:
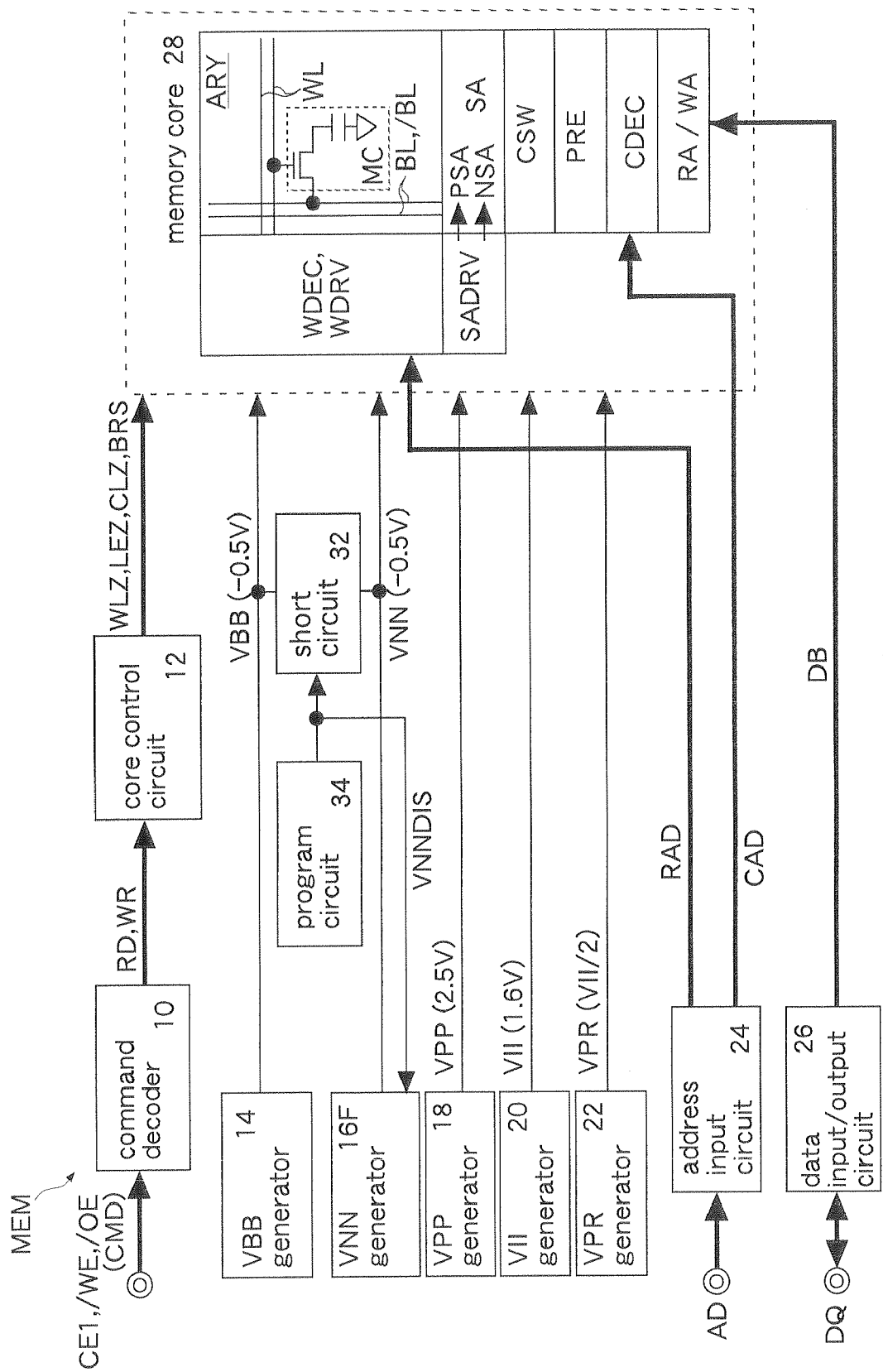
FIG. 13 is a block diagram showing a seventh embodiment of the present invention.

FIG. 13 shows a seventh embodiment of the present invention. The same symbols are used to designate the same elements as those described in the first and fourth embodiments, and a detailed description thereof is omitted. In this embodiment, a VNN generator 16F is formed instead of the VNN generator 16C of the fourth embodiment. Further, the comparator 30 is eliminated from the memory MEM of the fourth embodiment, and a program circuit 34 is added. The other constitutions are the same as in the fourth embodiment.

The program circuit 34 includes a fuse, for example, programmable from outside the memory MEM and responsive to a disable signal VNNDIS. The program circuit 34 inactivates the disable signal VNNDIS when the fuse is not programmed, and activates the disable signal VNNDIS when the fuse is programmed. For example, the fuse is a fuse programmed by irradiation of a laser beam. Alternatively, the fuse may be a fuse programmed by an overvoltage or an overcurrent, or may be constituted using an electrically programmable nonvolatile memory cell.

The VNN generator 16F generates the negative VNN during the inactivation of the disable signal VNNDIS (an operating state), and stops the operation of generating the negative voltage VNN during the activation of the disable signal VNNDIS (a non-operating state). The short circuit 32 disconnects the substrate voltage line VBB and the negative voltage line VNN when the disable signal VNNDIS is inactivated (the operating state), and shorts the substrate voltage line VBB and the negative voltage line VNN when the disable signal VNNDIS is activated (the non-operating state).

In this embodiment, for example, when in a test process of the memory MEM, it turns out that the substrate voltage VBB generated by the VBB generator 14 is higher than the negative voltage VNN generated by the VNN generator 16F, the fuse of the program circuit 34 is programmed. Thereby, the generation of the negative voltage VNN is stopped, and the substrate current is prevented from flowing to the transfer transistor TTR of the memory cell MC.

As described above, also in the seventh embodiment, the same effects as in the above first and fourth embodiments can be obtained. Further, by programming the program circuit 34 from outside the memory MEM, the generation of the negative voltage VNN is stopped. This can make the comparison operation by the comparator 30 of the fourth embodiment unnecessary, which can reduce power consumption.

Figure 14:
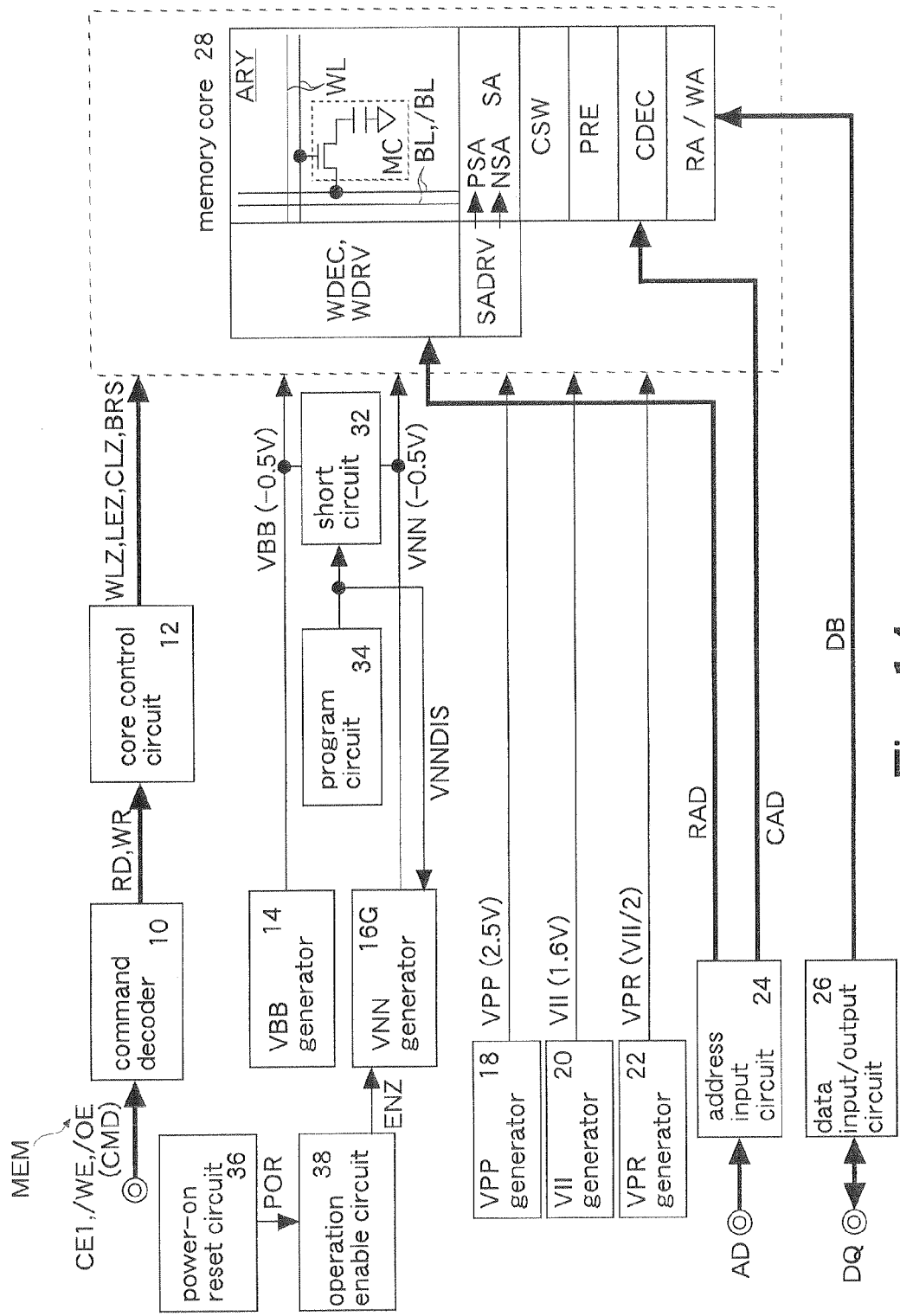
FIG. 14 is a block diagram showing an eighth embodiment of the present invention.

FIG. 14 shows an eighth embodiment of the present invention. The same symbols are used to designate the same elements as those described in the first, fourth, and seventh embodiments, and a detailed description thereof is omitted. In this embodiment, a VNN generator 16G is formed instead of the VNN generator 16F of the seventh embodiment. Further, a power-on reset circuit 36 and an operation enable circuit 38 are added to the memory MEM of the seventh embodiment. The other constitutions are the same as in the seventh embodiment.

When the memory MEM is powered on, the power-on reset circuit 36 activates a power-on reset signal POR for a period until the external power supply voltage rises to a predetermined voltage and thereafter inactivates it. Out of internal circuits of the memory MEM, circuits which require a reset operation are reset during the activation of the power-on reset signal POR. Incidentally, the power-on reset signal 36 is also mounted in the memories MEM of the above first to seventh embodiments.

The operation enable circuit 38 activates an enable signal ENZ for a predetermined period after the power-on reset signal POR is inactivated. Thus, the enable signal ENZ is activated only for the predetermined period from power-on. During the activation of the enable signal ENZ, the VNN generator 16G generates the negative voltage VNN even when the disable signal VNNDIS is activated. As just described, even when the program circuit 34 is programmed, the substrate voltage VBB and the negative voltage VNN are generated using not only the VBB generator 14 but also the VNN generator 16G for the predetermined period from power-on. Accordingly, even when the program circuit 34 is programmed, the time until the substrate voltage VBB and the negative voltage VNN are set to a desired negative voltage at power-on can be reduced. As a result, the time until the semiconductor memory MEM becomes accessible from power-on can be reduced. In other words, the time until the substrate voltage VBB and the negative voltage VNN are set to the desired negative voltage can be made constant irrespective of a programmed state of the program circuit 34. Incidentally, when the program circuit 34 is not programmed, the VNN generator 16G always operates regardless of the level of the enable signal ENZ.

As described above, also in the eighth embodiment, the same effects as in the above first, fourth, and seventh embodiments can be obtained. Further, even when the program circuit 34 is programmed, the time until the substrate voltage VBB and the negative voltage VNN are set to the desired negative voltage at power-on can be reduced.

Figure 15:
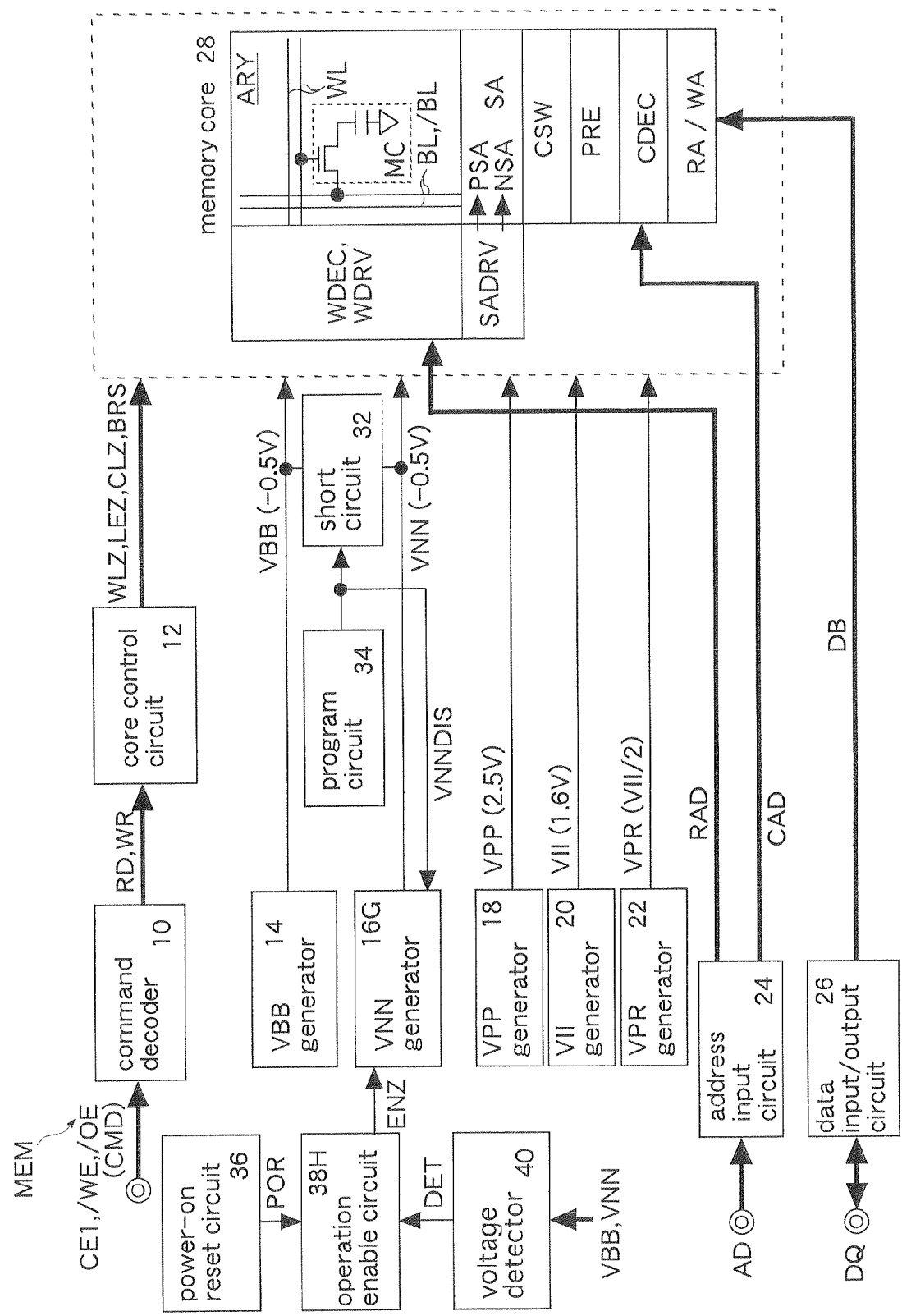
FIG. 15 is a block diagram showing a ninth embodiment of the present invention.

FIG. 15 shows a ninth embodiment of the present invention. The same symbols are used to designate the same elements as those described in the first, fourth, seventh, and eighth embodiments, and a detailed description thereof is omitted. In this embodiment, an operation enable circuit 38H is formed instead of the operation enable circuit 38 of the eighth embodiment. Further, a voltage detector 40 is added to the memory MEM of the eighth embodiment. The other constitutions are the same as in the eighth embodiment.

When both the substrate voltage VBB and the negative voltage VNN are a preset voltage or higher, the voltage detector 40 inactivates a detection signal DET. When one of the substrate voltage VBB and the negative voltage VNN becomes lower than the preset voltage (for example, −0.3 V), the voltage detector 40 activates the detection signal DET. The operation enable circuit 38H activates the enable signal ENZ in synchronization with the activation of the power-on reset signal POR, and inactivates the enable signal ENZ in synchronization with the activation of the detection signal DET.

In this embodiment, until one of the substrate voltage VBB and the negative voltage VNN becomes lower than the preset voltage after the memory MEM is powered on, the substrate voltage VBB and the negative voltage VNN are generated using not only the VBB generator 14 but also the VNN generator 16G. Therefore, even when the program circuit 34 is programmed, the time until the substrate voltage VBB and the negative voltage VNN are set to the desired negative voltage at power-on can be reduced. As described above, also in the ninth embodiment, the same effects as in the first, fourth, seventh, and eighth embodiments can be obtained.

Figure 16:
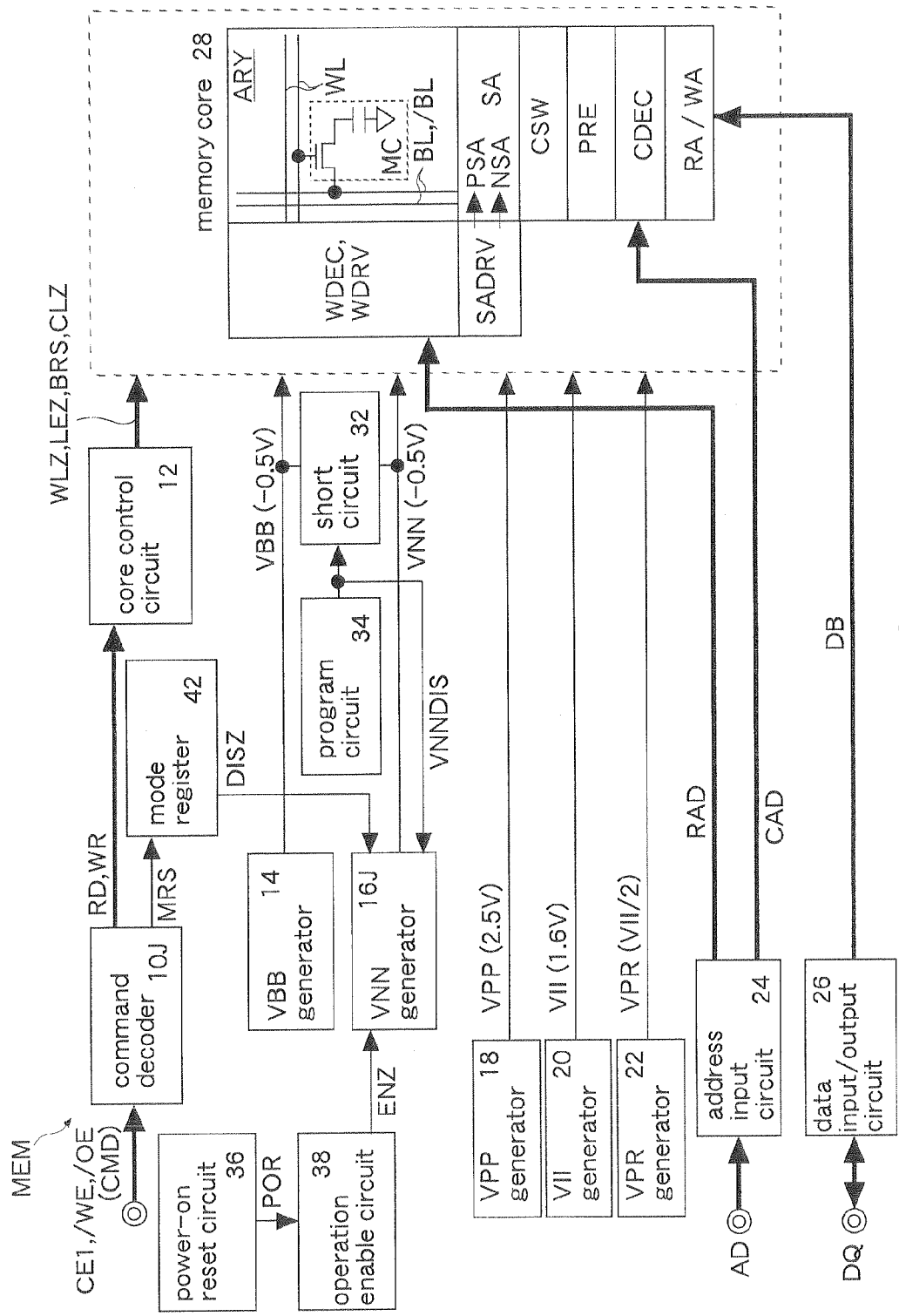
FIG. 16 is a block diagram showing a tenth embodiment of the present invention.

FIG. 16 shows a tenth embodiment of the present invention. The same symbols are used to designate the same elements as those described in the first, fourth, seventh, and eighth embodiments, and a detailed description thereof is omitted. In this embodiment, a command decoder 10J and a VNN generator 16J are formed instead of the command decoder 10 and the VNN generator 16G of the eighth embodiment. Further, a mode register 42 is added to the memory MEM of the eighth embodiment. The other constitutions are the same as in the eighth embodiment.

The command decoder 10J has a function of decoding the command signal CMD and recognizing a mode register set command MRS in addition to the function of the command decoder 10 of the first embodiment. The mode register set command MRS is a command to set the mode register 42.

The mode register 42 is set, for example, according to the address signal AD supplied together with the mode register set command MRS. The mode register 42 outputs a disable signal DISZ according to a set value. The mode register 42 outputs another mode signal not shown to change an operating specification of the memory MEM.

The VNN generator 16J ignores the disable signal DISZ during the inactivation of the disable signal VNNDIS (an unprogrammed state). Namely, during the inactivation of the disable signal VNNDIS, the VNN generator 16J always generates the negative voltage VNN independently of the logic level of the disable signal DISZ. When the disable signal DISZ is activated during the activation of the disable signal VNNDIS (a programmed state), the VNN generator 16J does not generate the negative voltage VNN even when the enable signal ENZ is activated. Therefore, even when the program circuit 34 is programmed, the operation/stop of the VNN generator 16J at power-on can be controlled by the disable signal DISZ generated by control from outside the memory MEM.

As described above, also in the tenth embodiment, the same effect as in the above first, fourth, seventh, and eighth embodiments can be obtained. Further, when the program circuit 34 is programmed by control from outside the memory MEM, the VNN generator 16J can be disabled from operating at power-on. As a result, the peak current at power-on can be decreased.

Figure 17:
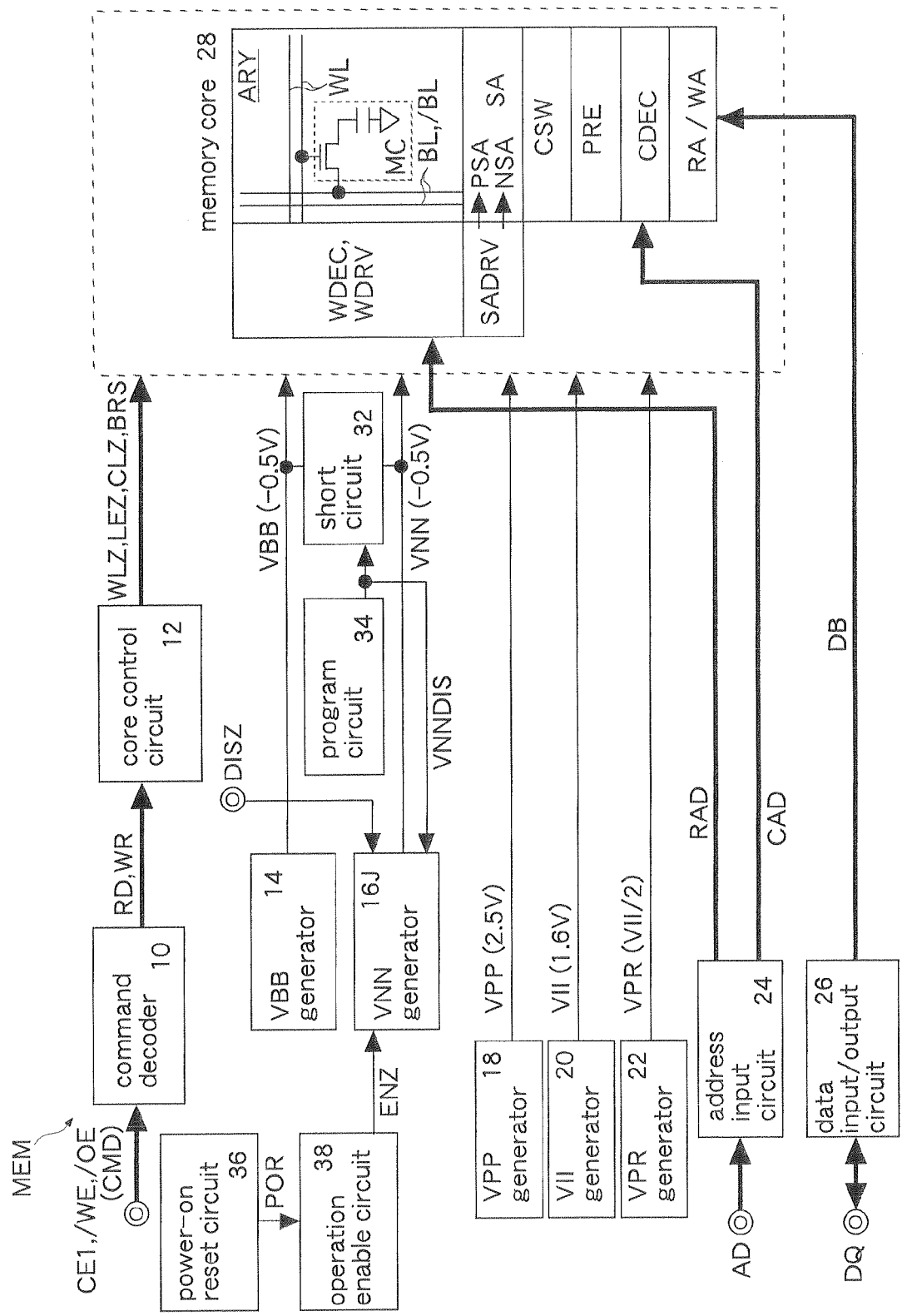
FIG. 17 is a block diagram showing an eleventh embodiment of the present invention.

FIG. 17 shows an eleventh embodiment of the present invention. The same symbols are used to designate the same elements as those described in the first, fourth, seventh, eighth, and tenth embodiments, and a detailed description thereof is omitted. In this embodiment, the command decoder 10 of the first embodiment is formed instead of the command decoder 10J of the tenth embodiment. Further, the mode register 42 is eliminated from the memory MEM of the eighth embodiment. Furthermore, the memory MEM includes an external terminal (pad) to receive the disable signal DISZ. The other constitutions are the same as in the tenth embodiment.

In this embodiment, for example, by connecting a disable signal terminal DISZ to a power supply line via a bonding wire or the like, the disable signal DISZ is always activated. By connecting the disable signal terminal DISZ to a ground line, the disable signal DISZ is always inactivated. The operation of the memory MEM according to the level of the disable signal DISZ is the same as in the tenth embodiment. As described above, also in the eleventh embodiment, the same effects as in the above first, fourth, seventh, eighth, and tenth embodiments an be obtained.

Incidentally, in the above embodiments, the example, in which the substrate voltage of the nMOS transistor connected to the bit line BL, /BL is set to the negative voltage VNN and the substrate voltage of the pMOS transistor connected to the bit line BL, /BL is set to the boosted voltage VPP is described. The present invention is not limited to these embodiments. For example, the substrate voltage of the nMOS transistor connected to the bit line BL, /BL may be set to a value lower than the negative voltage VNN. Also, the substrate voltage of the pMOS transistor connected to the bit line BL, /BL may be set to a value higher than the boosted voltage VPP.

The memory cell array ARY including the connection switch BT of the third embodiment may be applied to the second, and fourth to eleventh embodiments. The precharge circuit PRE of the second embodiment may be applied to the fourth to eleventh embodiments.

In the above embodiments, the example in which the present invention is applied to the FCRAM (pseudo SRAM) is described. The present invention is not limited to these embodiments. For example, the present invention may be applied to a DRAM or an SDRAM. In this case, an external refresh operation responsive to an external refresh request is performed as an external access operation. Further, the present invention may be applied to an SRAM, a nonvolatile memory, or the like.

The semiconductor memory to which the present invention is applied is not limited to a semiconductor memory chip (semiconductor memory device), and may be a semiconductor memory mounted on the SIP shown in FIG. 4, an MCM (Multi-Chip Module), or a COC (Chip On Chip) or a semiconductor memory core (semiconductor memory macro) implemented in a system LSI. Alternatively, it may be an embedded memory implemented in a CPU.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A method of controlling a semiconductor memory device, comprising:
   supplying a high level voltage to a word line when a memory cell is accessed, and
   supplying to the word line a first low level voltage which is a minus voltage when the memory cell is not accessed;
   turning off a precharge switch, which couples a bit line to a precharge voltage line, during a standby period when the memory cell is not accessed; and
   setting a substrate voltage of an nMOS transistor whose source or drain is coupled to the bit line to the first low level voltage or a value lower than the first low level voltage.

2. A method according to claim 1, further comprising:
   supplying a second low level voltage, which is substantially equal to or lower than the first low level voltage, to a substrate of a memory cell.

3. A method according to claim 1, further comprising:
   supplying an internal voltage, which is lower than the high level voltage, to an internal circuit.

4. A method according to claim 1, further comprising:
   activating a sense amplifier after supplying the high level voltage to the word line.

5. A method according to claim 1, further comprising:
   turning on a column switch which couples the bit line to a data line after activating a sense amplifier.

6. A method according to claim 2, further comprising:
   generating the second low level voltage at a peripheral portion of the semiconductor memory device.

7. A method according to claim 1, further comprising:
   generating the high level voltage at a peripheral portion of the semiconductor memory device.

8. A method according to claim 1, further comprising:
   generating a detection signal for adjusting the high level voltage.

9. A method according to claim 1, further comprising:
   adjusting the high level voltage by a program circuit including a fuse.

10. A method according to claim 9, wherein the fuse is programmed in a test process of the semiconductor memory device.

11. A method according to claim 1, further comprising:
    turning on the precharge switch during a time period which is shorter than the standby period before activating the word line.

12. A method according to claim 1, further comprising:
    turning on the precharge switch during a time period which is shorter than the standby period after deactivating the word line.

13. A method according to claim 1, wherein the nMOS transistor is provided in a sense amplifier, a column switch, a precharge circuit, or any combination thereof.

* * * * *